(12) United States Patent
Ding

(10) Patent No.: US 6,893,921 B2
(45) Date of Patent: May 17, 2005

(54) NONVOLATILE MEMORIES WITH A FLOATING GATE HAVING AN UPWARD PROTRUSION

(75) Inventor: Yi Ding, Sunnyvale, CA (US)

(73) Assignee: Mosel Vitelic, Inc., Hsin-Chu (TW)

(*) Notice: Subject to any disclaimer, the term of this patent is extended or adjusted under 35 U.S.C. 154(b) by 271 days.

(21) Appl. No.: 10/411,813

(22) Filed: Apr. 10, 2003

(65) Prior Publication Data

US 2004/0201059 A1 Oct. 14, 2004

(51) Int. Cl.[7] .................................. H01L 27/108
(52) U.S. Cl. ................. 438/259; 438/247; 438/290; 438/291; 438/302; 438/386; 438/399; 257/296; 257/305
(58) Field of Search .................. 257/296–310; 438/250–400

(56) References Cited

U.S. PATENT DOCUMENTS

| | | | |
|---|---|---|---|
| 5,402,371 A | 3/1995 | Ono | |
| 5,856,943 A | 1/1999 | Jeng | |
| 5,901,084 A | 5/1999 | Ohnakado | |
| 6,057,575 A | 5/2000 | Jenq | |
| 6,130,129 A | 10/2000 | Chen | |
| 6,134,144 A | 10/2000 | Lin et al. | |
| 6,171,909 B1 | 1/2001 | Ding et al. | |
| 6,200,856 B1 | 3/2001 | Chen | |
| 6,236,082 B1 * | 5/2001 | Kalnitsky et al. | 257/315 |
| 6,261,903 B1 | 7/2001 | Chang et al. | |
| 6,266,278 B1 | 7/2001 | Harari et al. | |
| 6,326,661 B1 | 12/2001 | Dormans et al. | |
| 6,355,524 B1 | 3/2002 | Tuan et al. | |
| 6,365,457 B1 | 4/2002 | Choi | |
| 6,414,872 B1 | 7/2002 | Bergemont et al. | |
| 6,420,231 B1 | 7/2002 | Harari et al. | |
| 6,437,360 B1 | 8/2002 | Cho et al. | |
| 6,438,036 B2 | 8/2002 | Seki et al. | |
| 6,444,525 B1 * | 9/2002 | Lee | 438/259 |
| 6,486,023 B1 | 11/2002 | Nagata | |
| 6,518,618 B1 | 2/2003 | Fazio et al. | |
| 6,541,324 B1 | 4/2003 | Wang | |
| 6,541,829 B2 | 4/2003 | Nishinohara et al. | |
| 2002/0064071 A1 | 5/2002 | Takahashi et al. | |
| 2002/0197888 A1 | 12/2002 | Huang et al. | |
| 2003/0218908 A1 | 11/2003 | Park et al. | |
| 2004/0004863 A1 | 1/2004 | Wang | |

FOREIGN PATENT DOCUMENTS

EP    0 938 098 A2    8/1999

OTHER PUBLICATIONS

Ma, Yale et al., "A Dual–Bit Split–Gate EEPROM (DS'G) Cell in Contactless Array for Single Vcc High Density Flash Memories," 1994 IEEE, 3.5.1–3.5.4.

(Continued)

*Primary Examiner*—Fetsum Abraham
(74) *Attorney, Agent, or Firm*—Michael Shenker; MacPherson Kwok Chen & Heid LLP

(57) ABSTRACT

In a nonvolatile memory cell, the floating gate (160) has an upward protruding portion. This portion can be formed as a spacer over a sidewall of the select gate (140). The spacer can be formed from a layer (160.2) deposited after the layer (160.1) which provides a lower portion of the floating gate. Alternatively, the upward protruding portion and the lower portion can be formed from the same layers or sub-layers all of which are present in both portions. The control gate (170) can be defined without photolithography. Other embodiments are also provided.

27 Claims, 42 Drawing Sheets

OTHER PUBLICATIONS

Spinelli, Alessandro S., "Quantum–Mechanical 2D Simulation of Surface–and Buried–Channel p–MOS,"2000 International Conference on Simulation of Semiconductor Processes and Devices: SISPAD 2000. Seattle, WA Sep. 6–8, 2000.

Kim, K.S. et al. "A Novel Dual String NOR (DuSnor) Memory Cell Technolgy Scalable to the 256 Mbit and 1 Gbit Flash Memories," 1995 IEEE 11.1.1–11.1.4.

Bergemont, A. et al."NOR Virtual Ground (NVG)– A New Scaling Concept for Very High Density FLAS EEPROM and its Implementation in a 0.5 um Process," 1993 IEEE 2.2.1–2.2.4.

Van Duuren, Michiel et al., "Compact poly–CMP Embedded Flash Memory Cells For One or Two Bit Storage," Philips Research Leuven, Kapeldreef 75, B3001 Leuven, Belgium, pp. 73–74.

U.S. Appl. No. 10/440,466, entitled "Fabrication Of Conductive Gates For Nonvolatile Memories From Layers With Protruding Portions," filed May 16, 2003.

U.S. Appl. No. 10/440,005, entitled "Fabrication of Dielectric On A Gate Surface To Insulate The Gate From Another Element Of An Integrated Circuit," filed May 16, 2003.

U.S. Appl. No. 10/440,508, entitled "Fabrication Of Gate Dielectric In Nonvolatile Memories Having Select, Floating And Control Gates," filed May 16, 2003.

U.S. Appl. No. 10/440,500, entitled "Integrated Circuits With Openings that Allow Electrical Contact To Conductive Features Having Self–Aligned Edges," filed May 16, 2003.

U.S. Appl. No. 10/393,212, entitled "Nonvolatile Memories And Methods Of Fabrication," filed Mar. 19, 2003.

U.S. Appl. No. 10/393,202, entitled "Fabrication of Integrated Circuit Elements In Structures With Protruding Features," filed Mar. 19, 2003.

U.S. Appl. No. 10/631,941, entitled "Nonvolatile Memory Cell With Multiple Floating Gates Formed After The Select Gate," filed Jul. 30, 2003.

U.S. Appl. No. 10/632,155, entitled "Nonvolatile Memory Cells With Buried Channel Transistors," filed Jul. 30, 2003.

U.S. Appl. No. 10/632,007, entitled "Arrays Of Nonvolatile Memory Cells Wherin Each Cell Has Two Conductive Floating Gates," filed Jul. 30, 2003.

U.S. Appl. No. 10/631,452, entitled "Fabrication Of Dielectric For A Nonvolatile Memory Cell Having Multiple Floating Gates," filed Jul. 30, 2003.

U.S. Appl. No. 10/632,154, entitled "Fabrication Of Gate Dielectric In Nonvolatile Memories In Which A Memory Cell Has Multiple Floating Gates," filed Jul. 30, 2003.

U.S. Appl. No. 10/631,552, entitled "Nonvolatile Memories And Methods Of Fabrication," filed Jul. 30, 2003.

U.S. Appl. No. 10/632,186, entitled "Nonvolatile Memory Cell With Multiple Floating Gates Formed After The Select Gate And Having Upward Protrusions," filed Jul. 30, 2003.

U.S. Appl. No. 10/393,212, filed Mar. 19, 2003 entitled "Nonvolatile Memories And Methods of Fabrication."

U.S. Appl. No. 10/393,202, filed Mar. 19, 2003, entitled "Fabrication of Integrated Circuit Elements In Structures With Protruding Features."

Naruke, K.; Yamada, S.; Obi, E.; Taguchi, S.; and Wada, M. "A New Flash–Erase EEPROM Cell with A Sidewall Select–Gate On Its Source Side," 1989 IEEE, pp. 604–606.

Wu, A.T.; Chan T.Y.; Ko, P.K.; and Hu, C. "A Novel High–Speed. 5–Volt Programming EPROM Structure With Source–Side Injection," 1986 IEEE, 584–587.

Mizutani, Yoshihisa: and Makita, Koji "A New EPROM Cell With A Sidewall Floating Gate Fro High–Density and High Performance Device," 1985 IEEE, 635–638.

Ma, Y.; Pang, C.S.: Pathak, J.: Tsao, S.C.: Chang, C.F.; Yamauchi, Y.; Yohsimi, M. "A Novel High Density Contactless Flash Memory Array Using Split–Gate Source–Side–Injection Cell for 5V–Only Applications," 1994 Symposium on VLSI Technology Digest of Technical Papers, pp. 49–50.

Shirota, Riichiro "A Review of 256Mbit NAND Flash Memories and NAND Flash Future Trend," Feb. 2000, Nonvolatile Memory Workshop in Monterey, California.. pp. 22–31.

Mih, Rebecca et al, "0.18um Modular Triple Self–Aligned Embedded Split–Gate Flash Memory," 2000 Symposium on VLSI Technology Digest of Technical Papers, pp. 120–121.

U.S. Appl. No. 10/798,475, entitled "Fabrication of Conductive Lines Interconnecting Conductive Gates in Non-volatile Memories and Non–Volatile Memory Structures," filed Mar. 10, 2004.

U.S. Appl. No. 10/797,972, entitled "Fabrication of Conductive Lines Interconnecting First Conductive Gates in Nonvolatile Memories Having Second Conductive Gates Provided By Conductive Gates Lines, Wherein The Adjacent Conductive Gate Lines For The Adjacent Columns Are Spaced From Each Other, And Non–Volatile Memory Structures," filed Mar. 10, 2004.

* cited by examiner

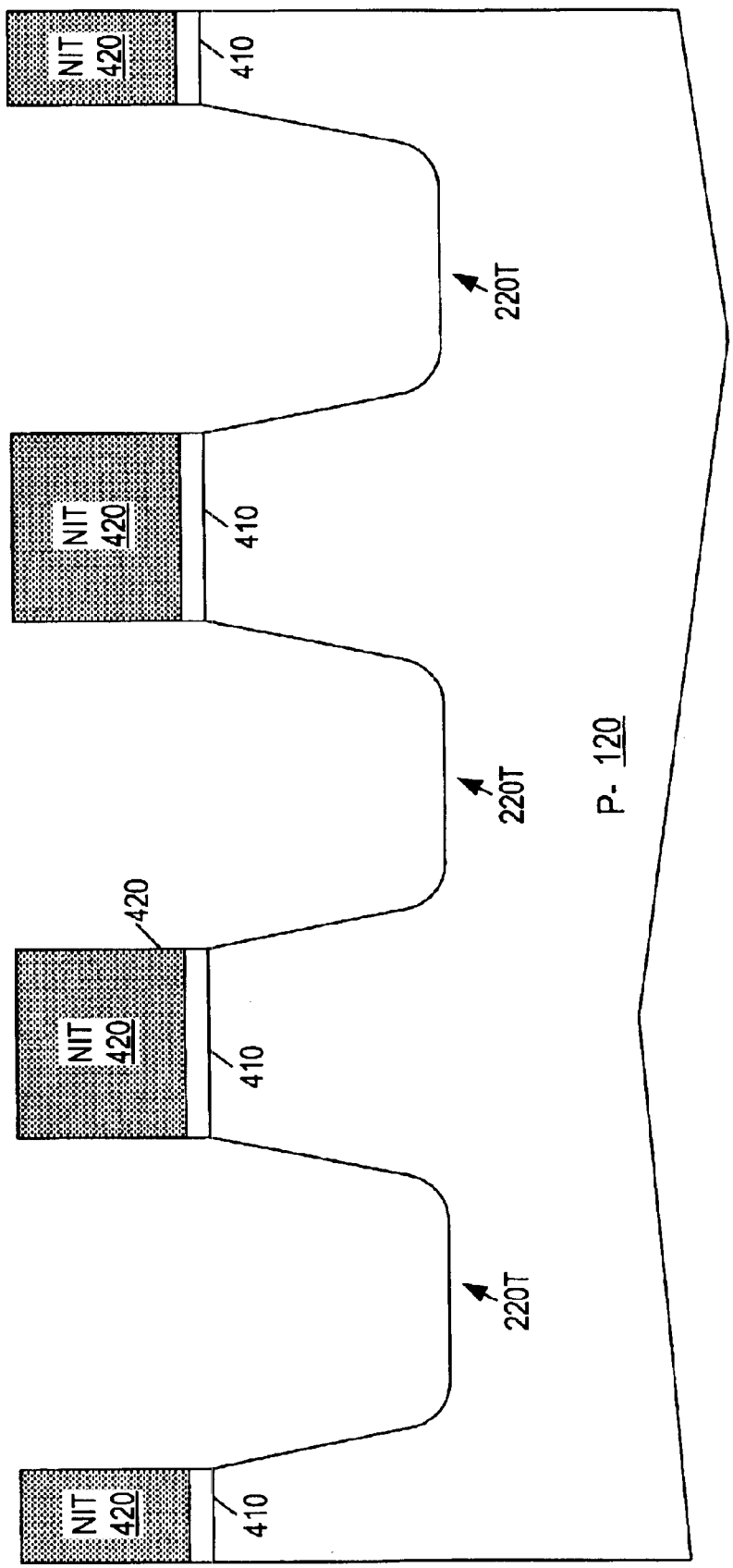
FIG. 4 (Y1-Y1')

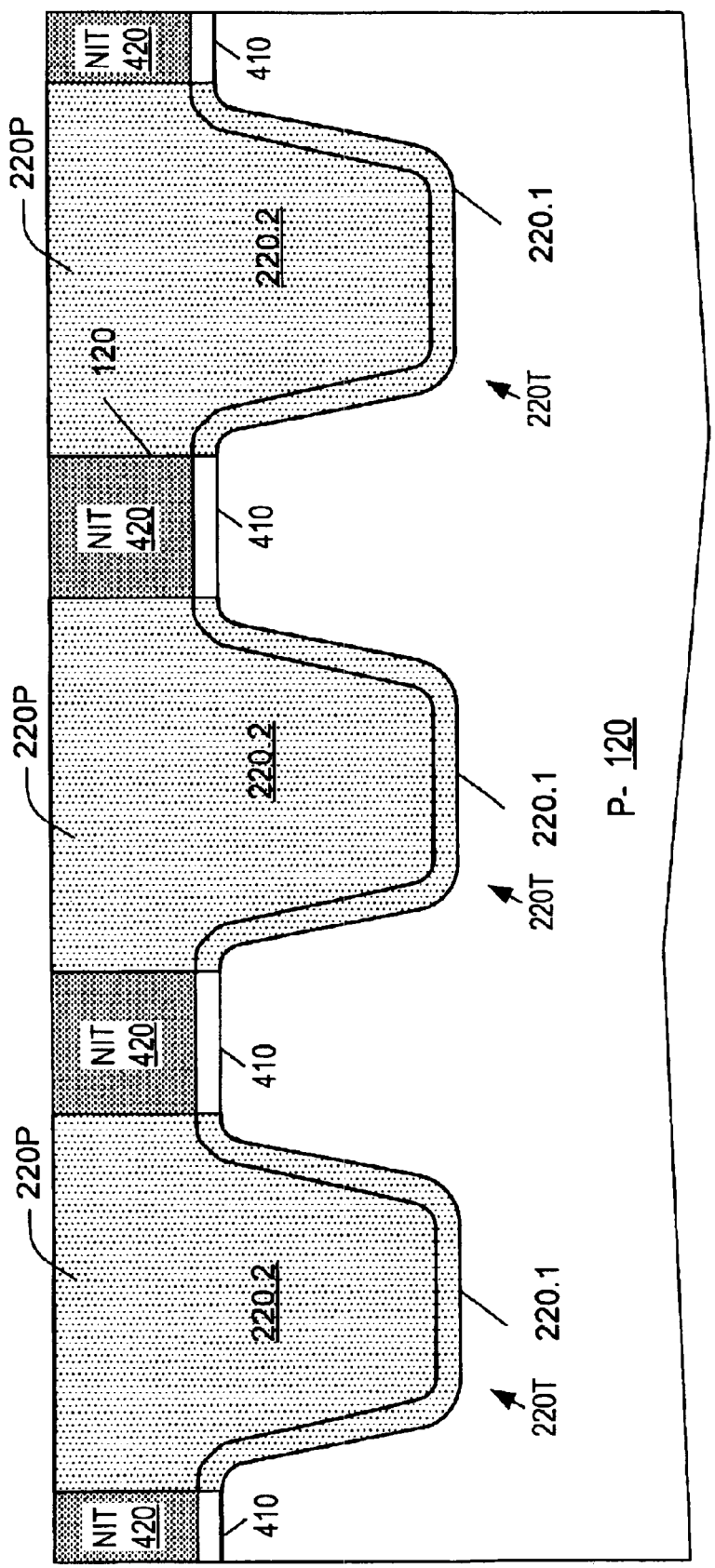
FIG. 5 (Y1-Y1')

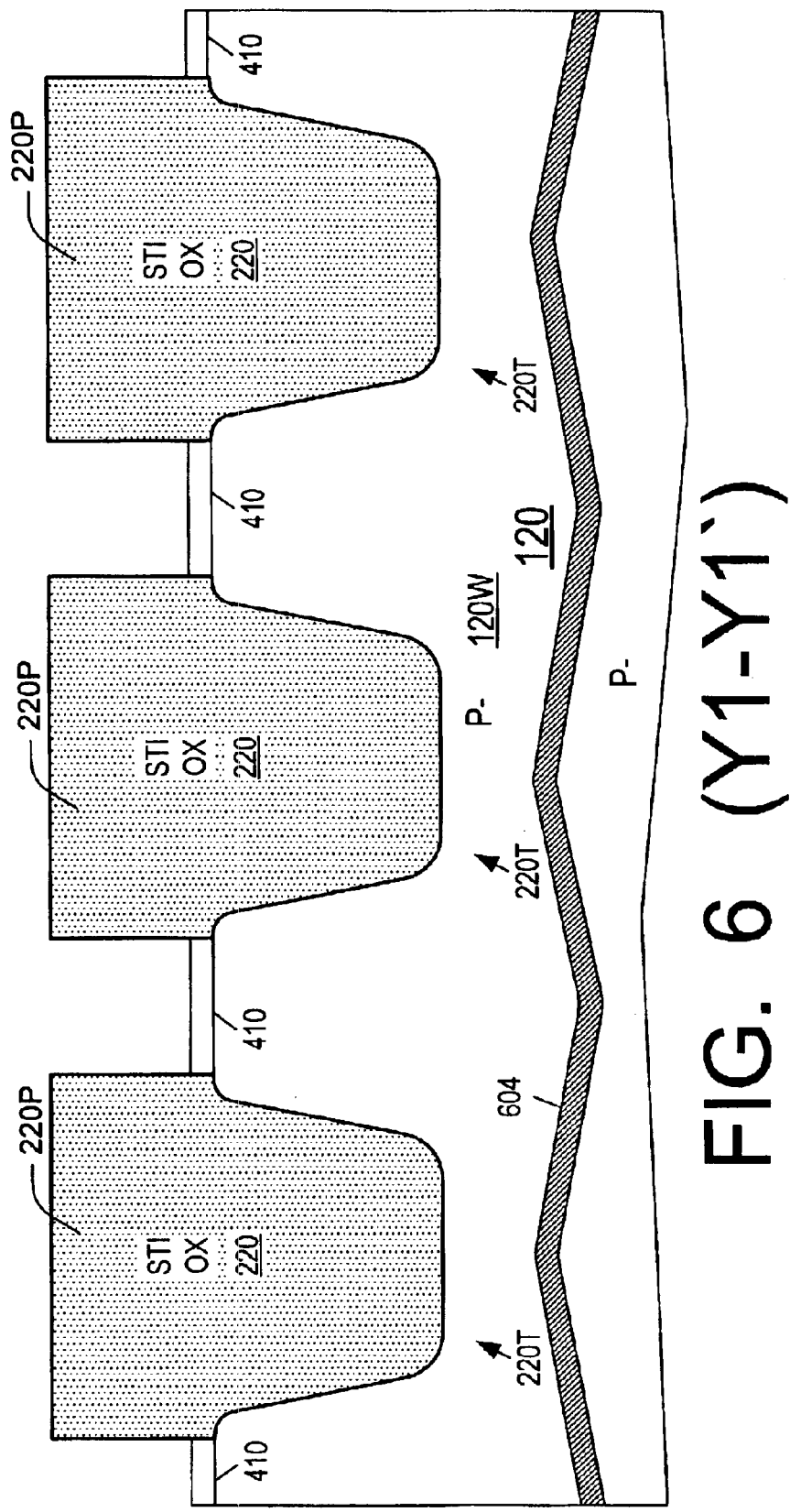
FIG. 6 (Y1-Y1')

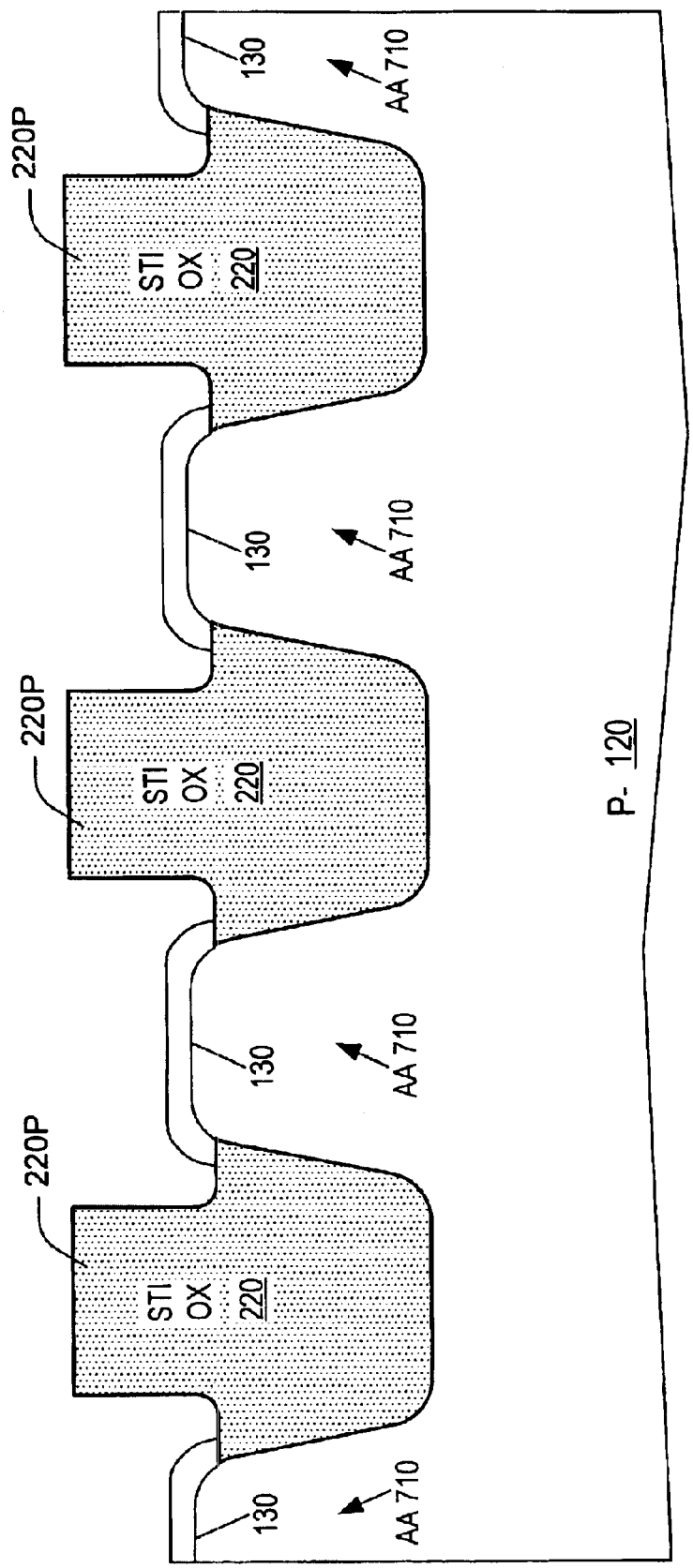
FIG. 7 (Y1-Y1')

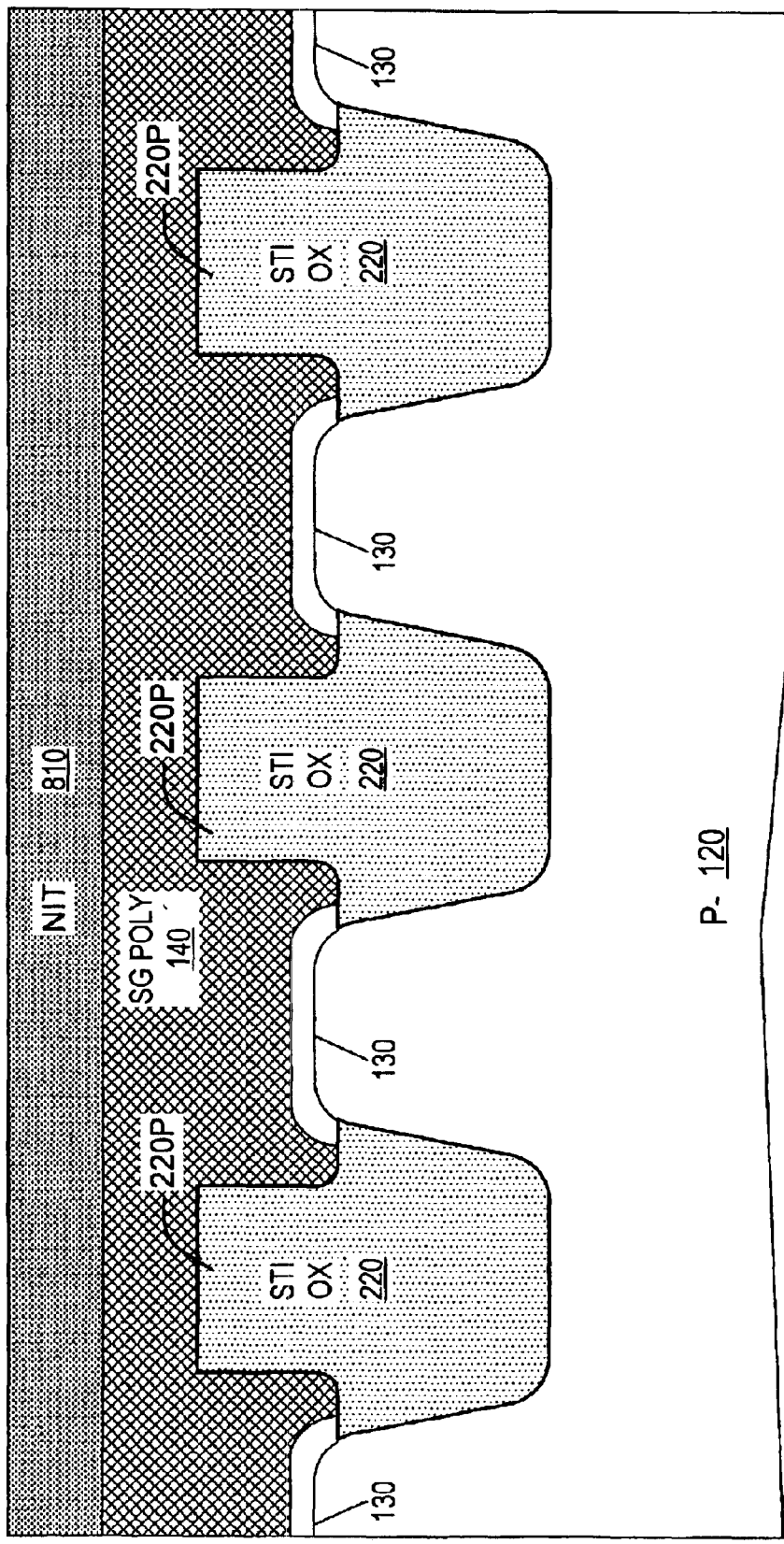
FIG. 8 (Y1-Y1')

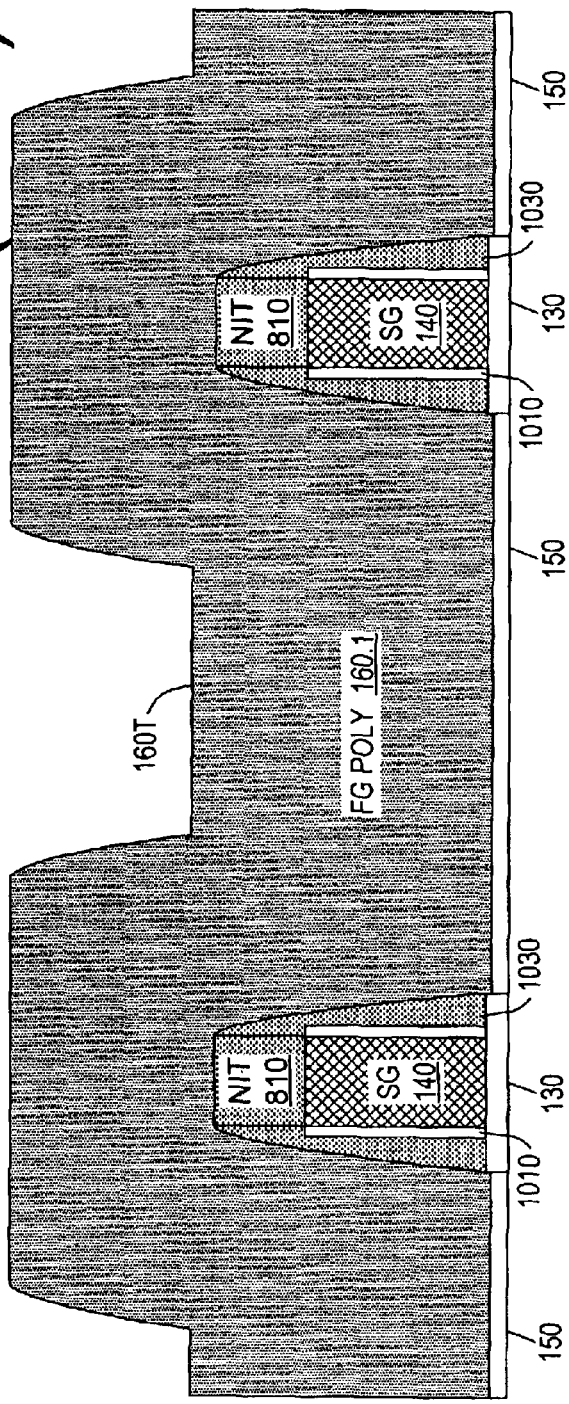

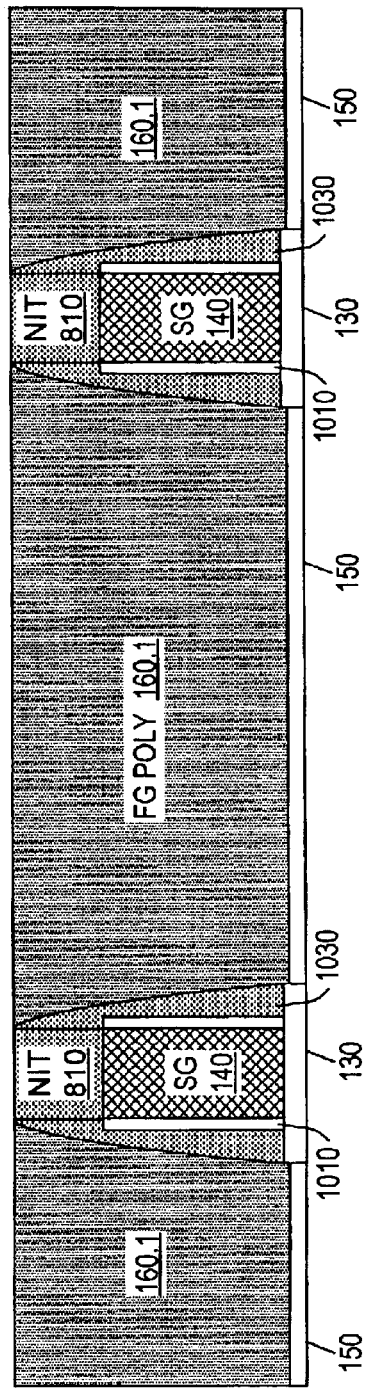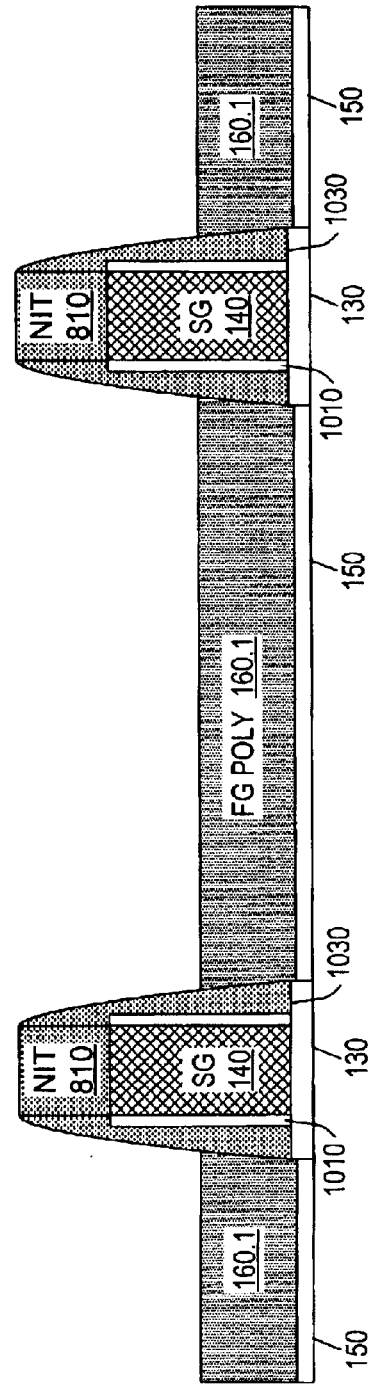

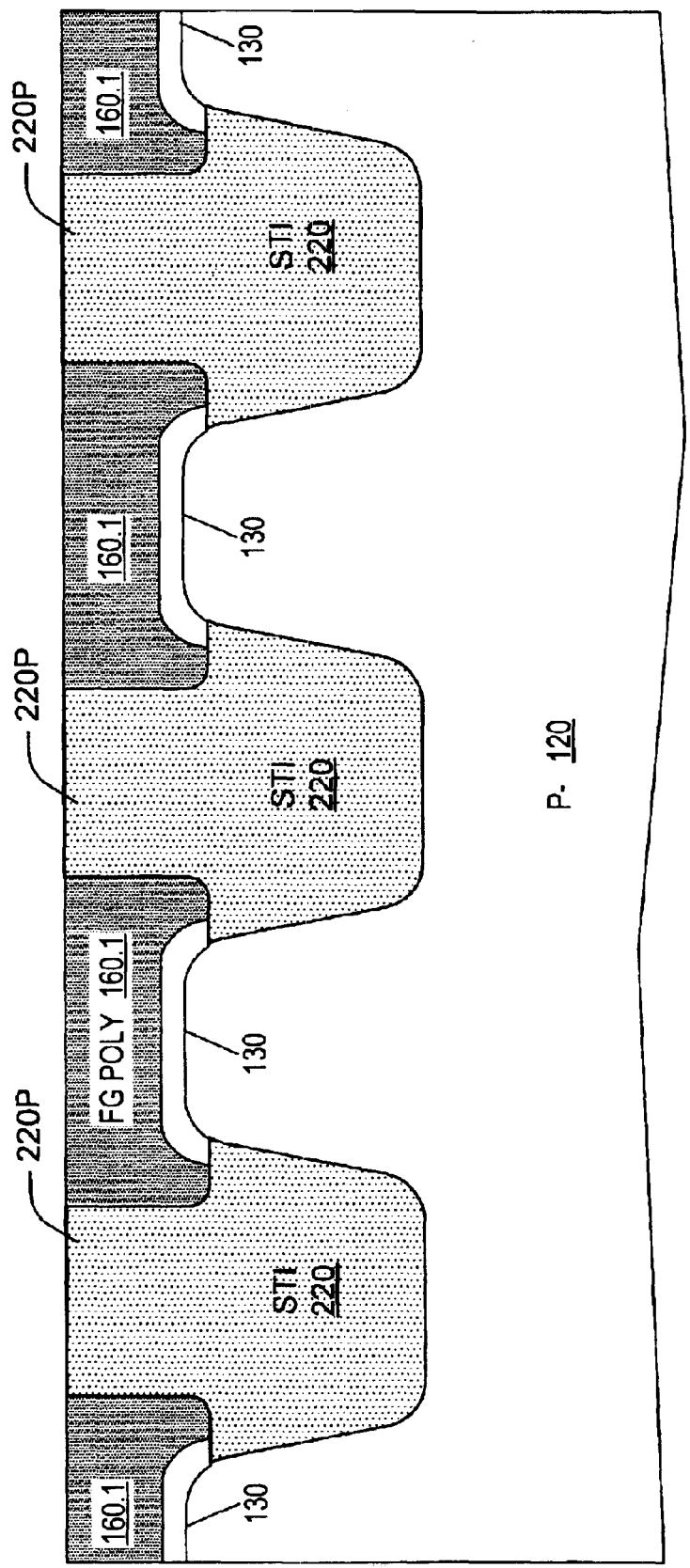
FIG. 13B (Y2-Y2')

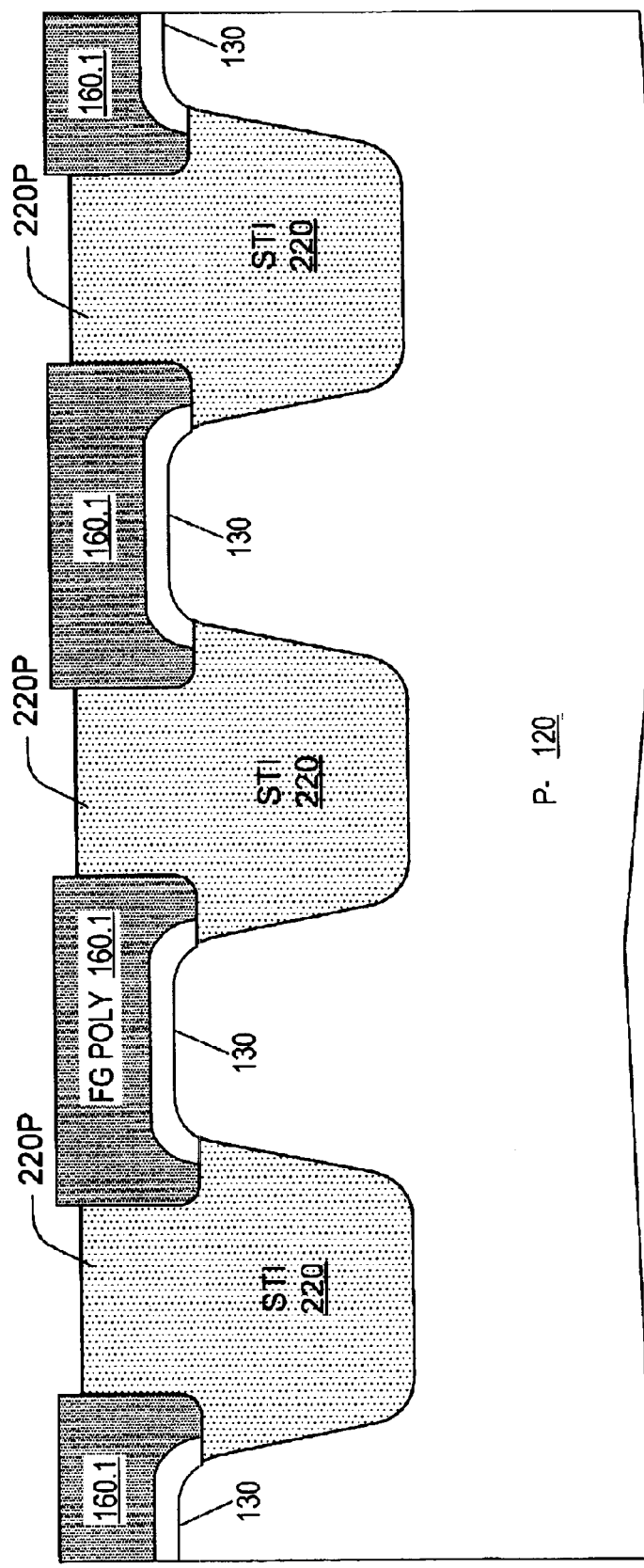
FIG. 14 (Y2-Y2')

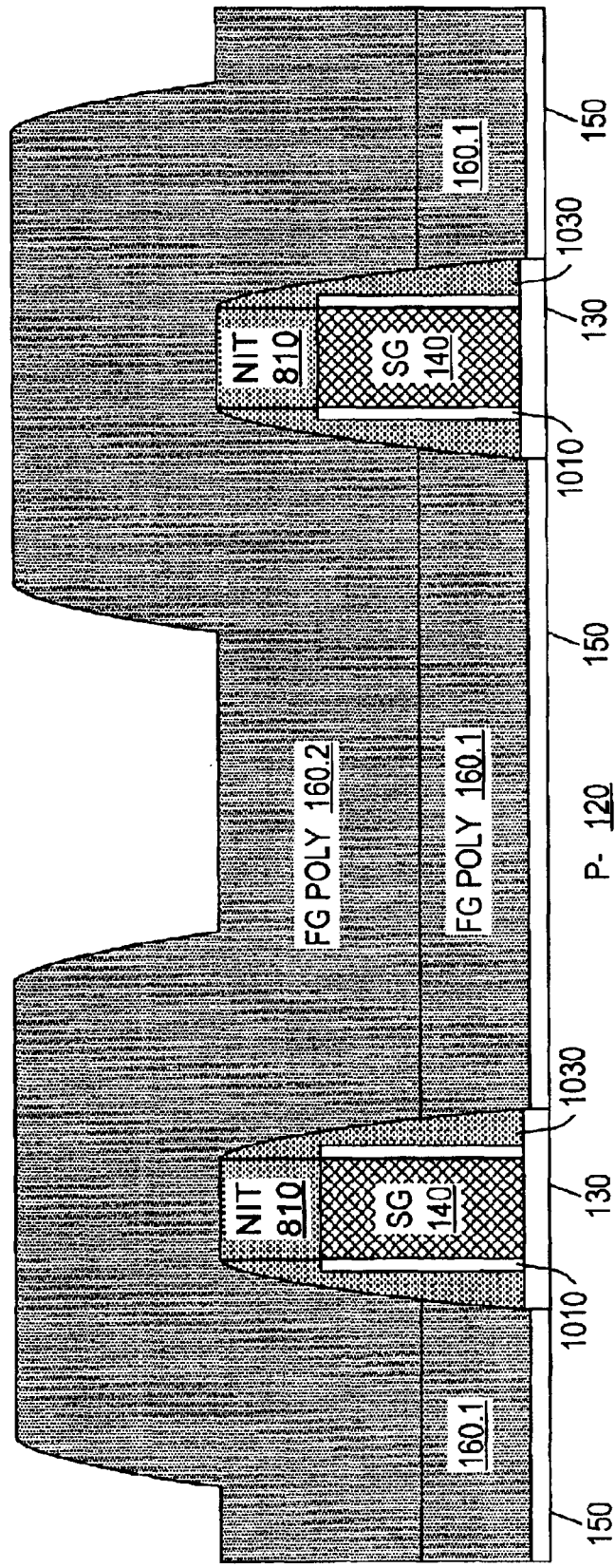
FIG. 15 (X-X')

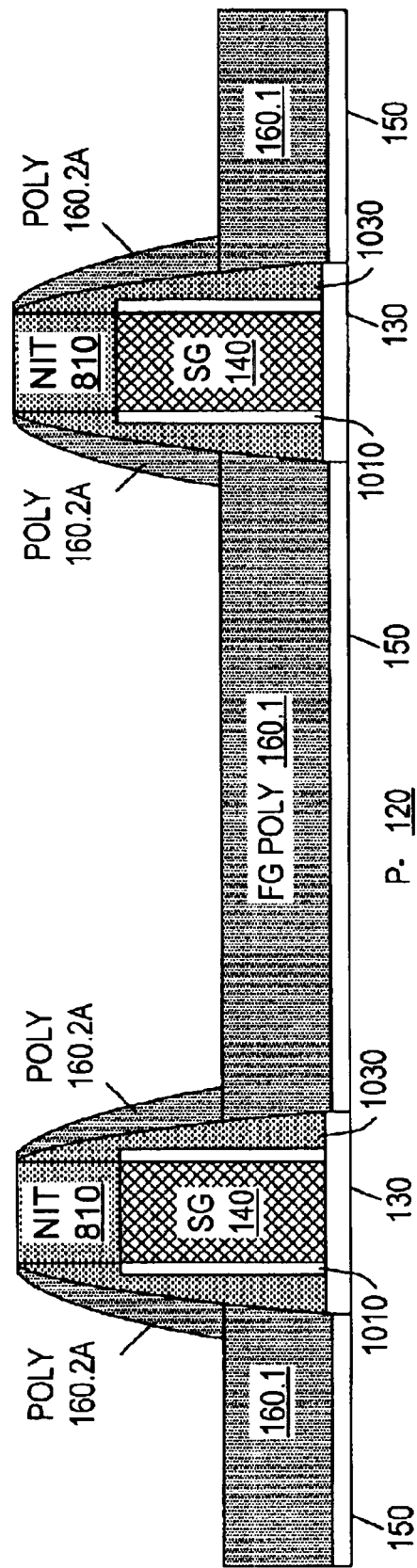
FIG. 16A (X-X')

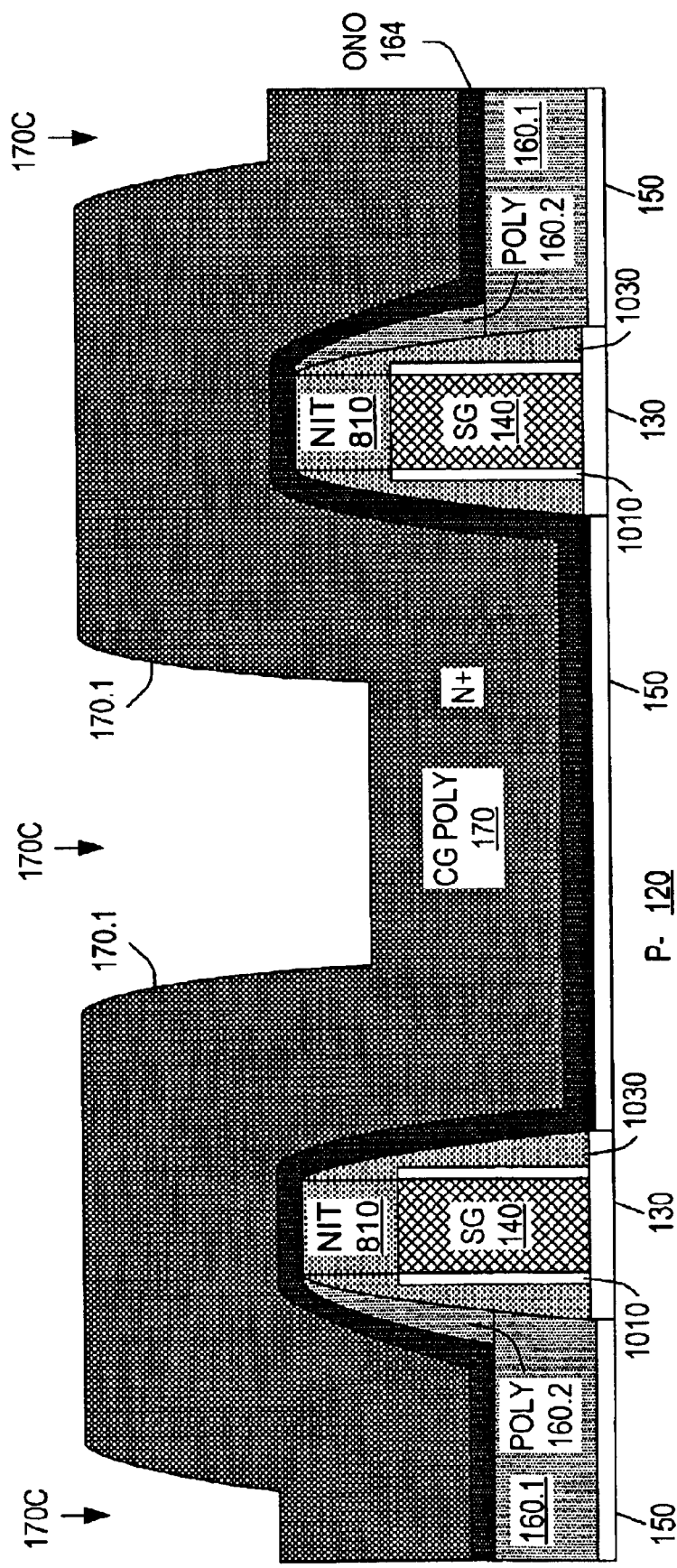
FIG. 18 (X-X')

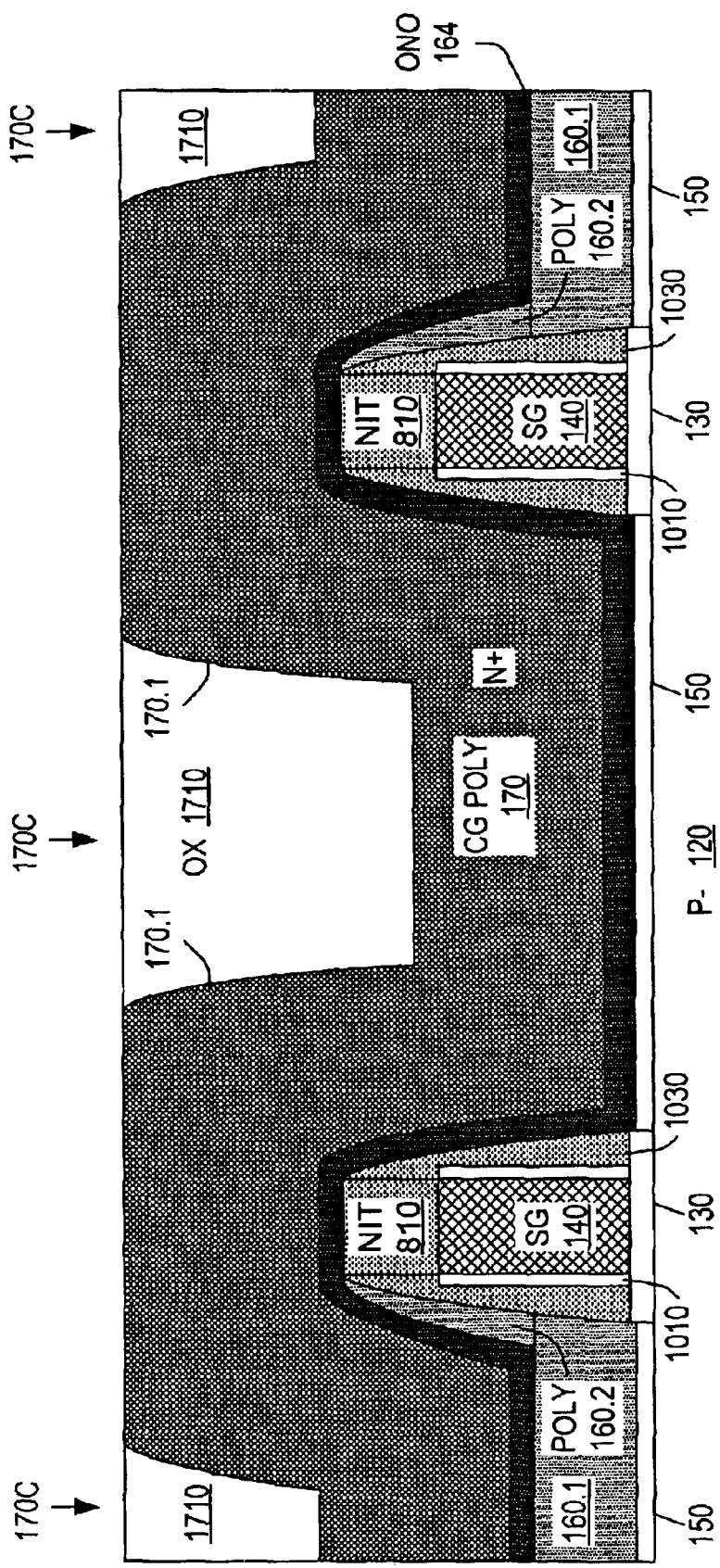
FIG. 19 (X-X')

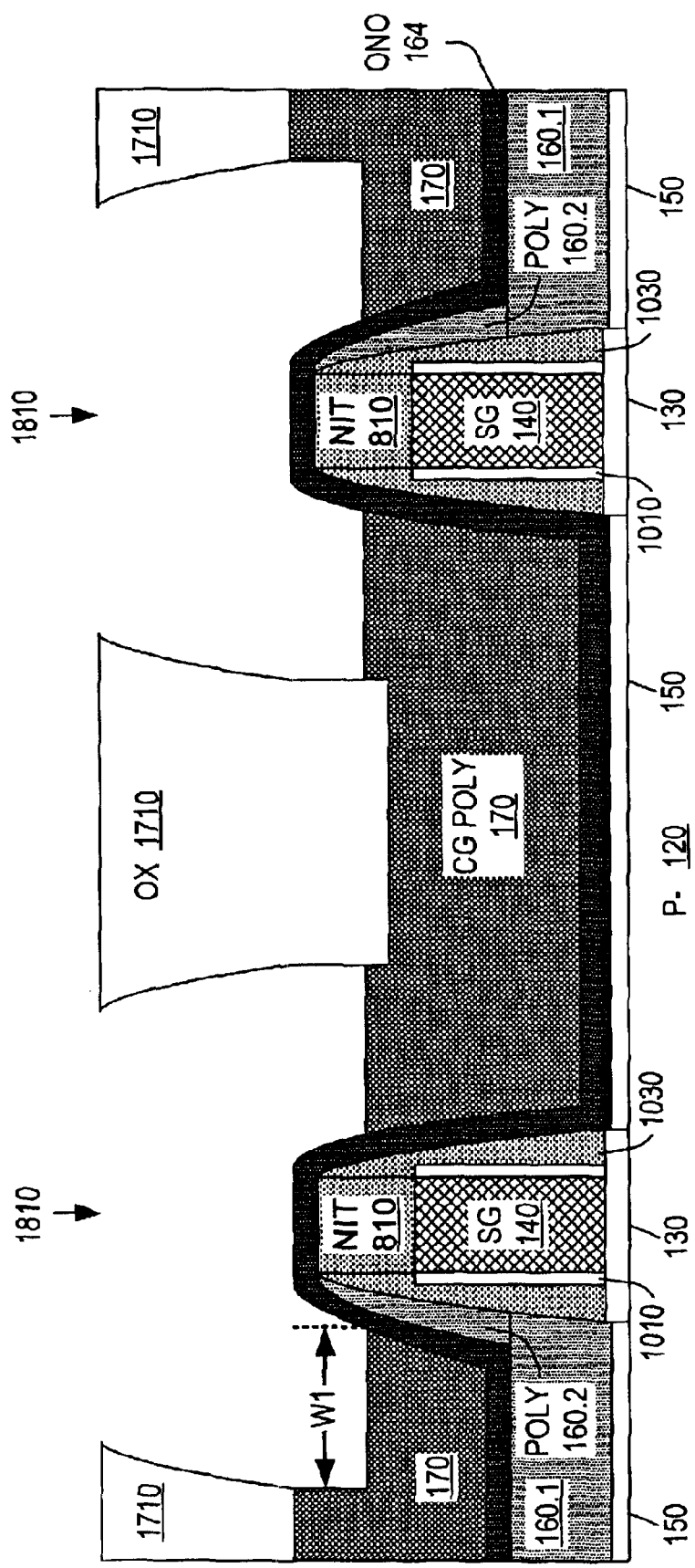
FIG. 20 (X-X')

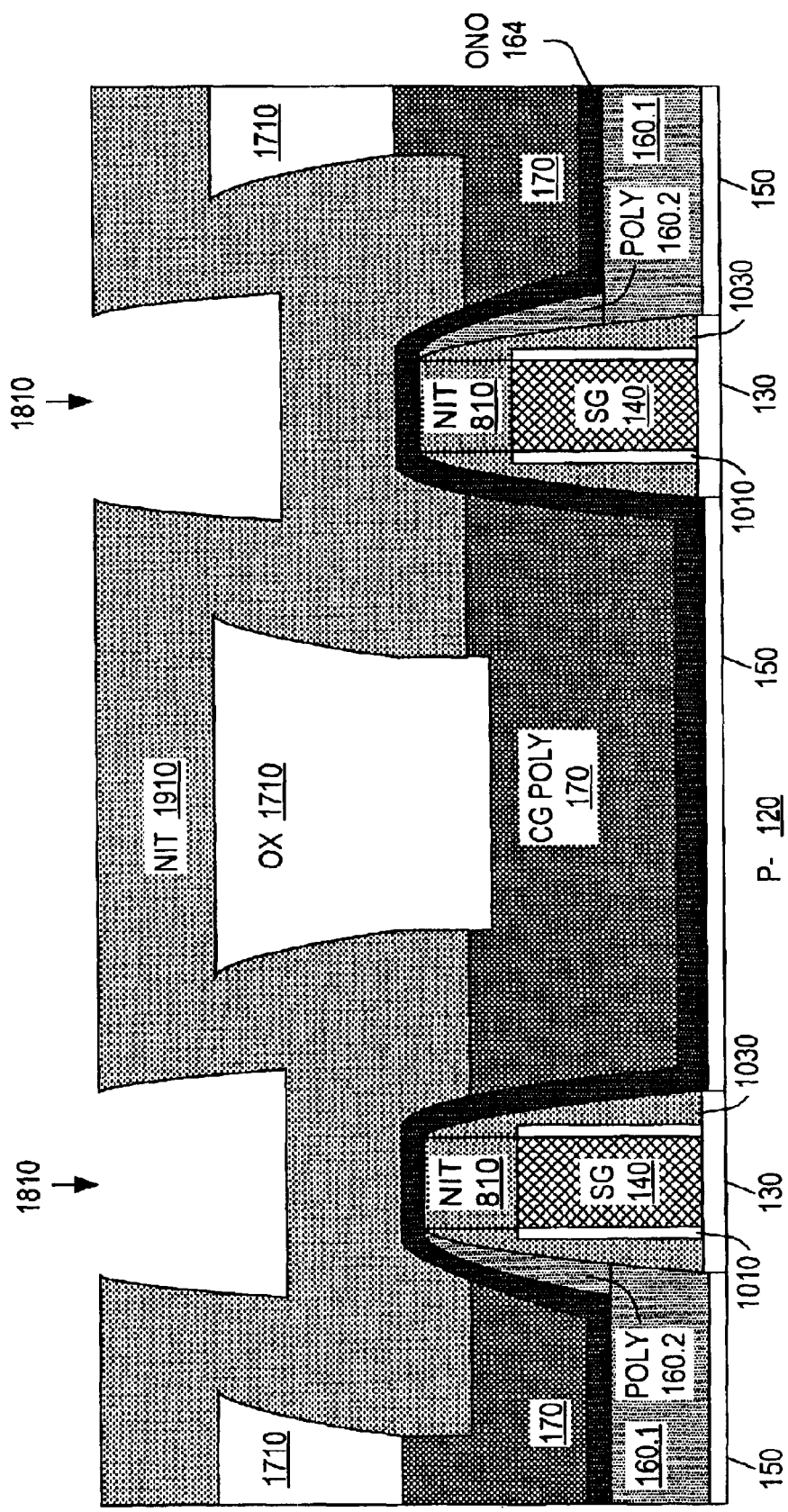
FIG. 21 (X-X')

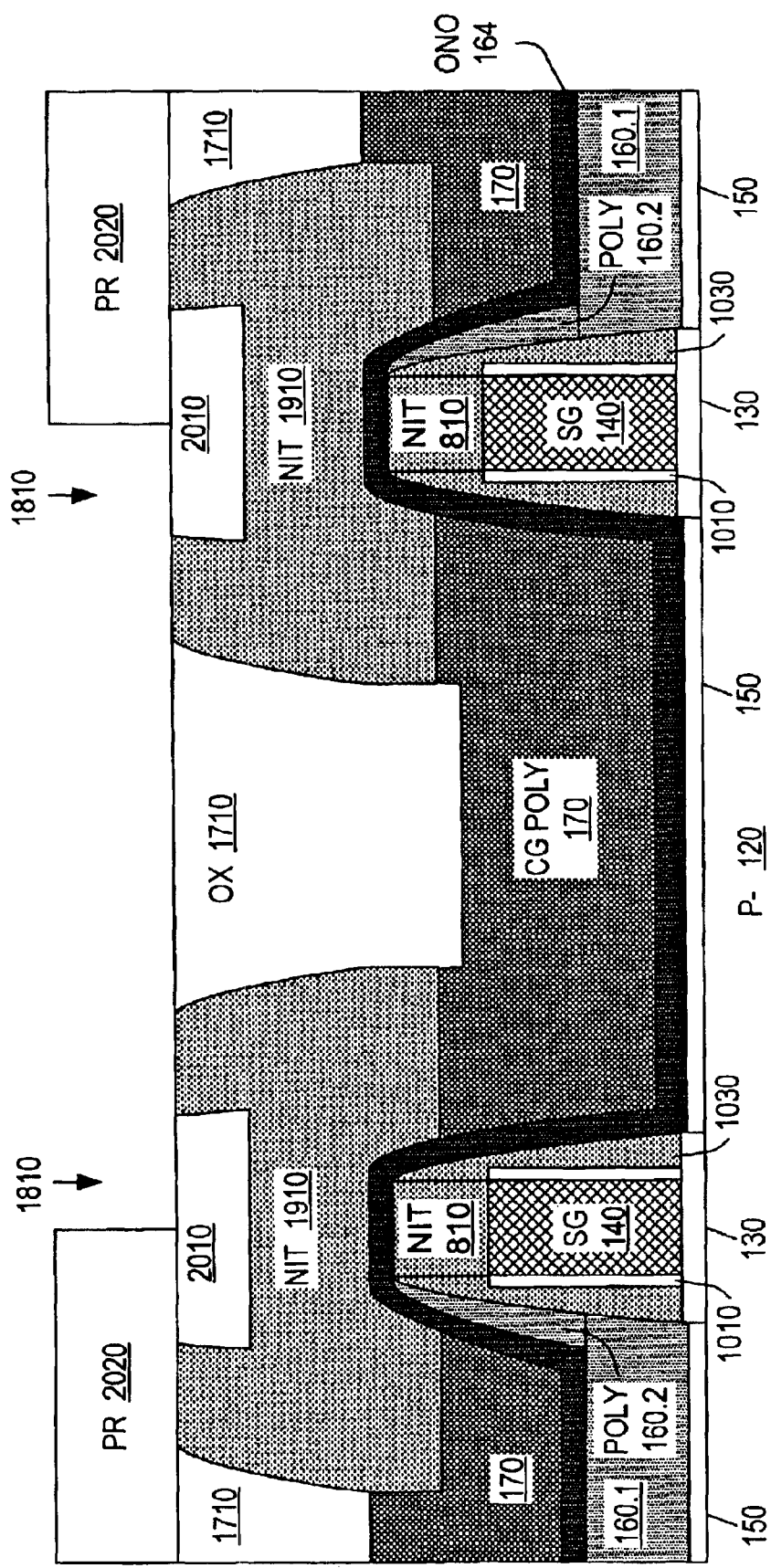
FIG. 22A (X-X')

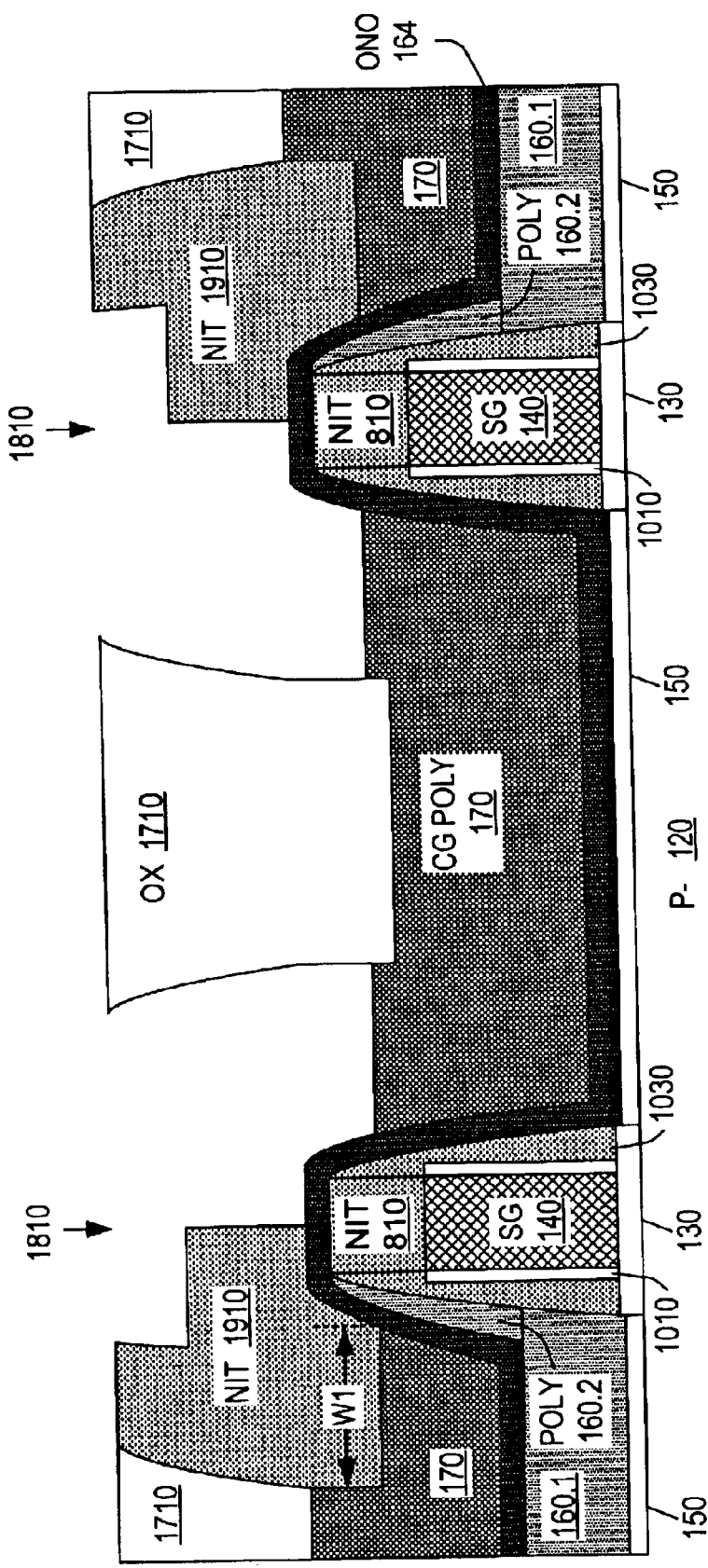
FIG. 23 (X-X')

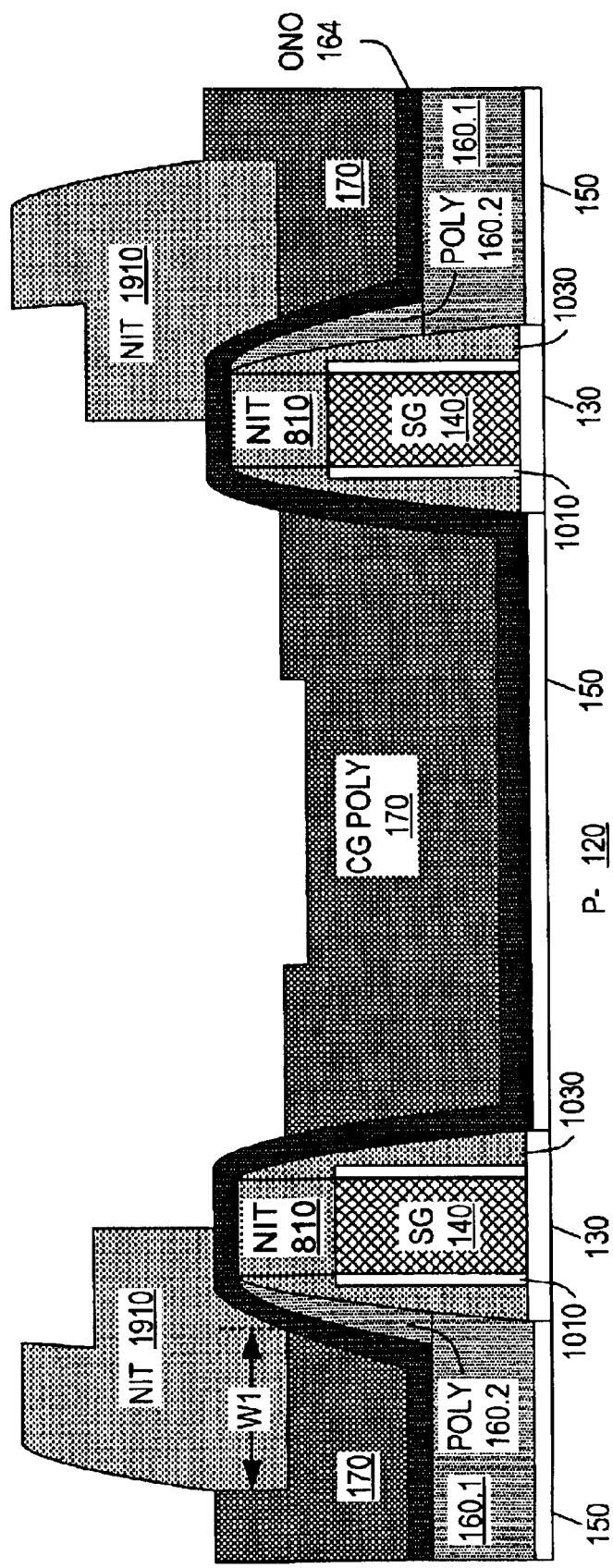
FIG. 24 (X-X')

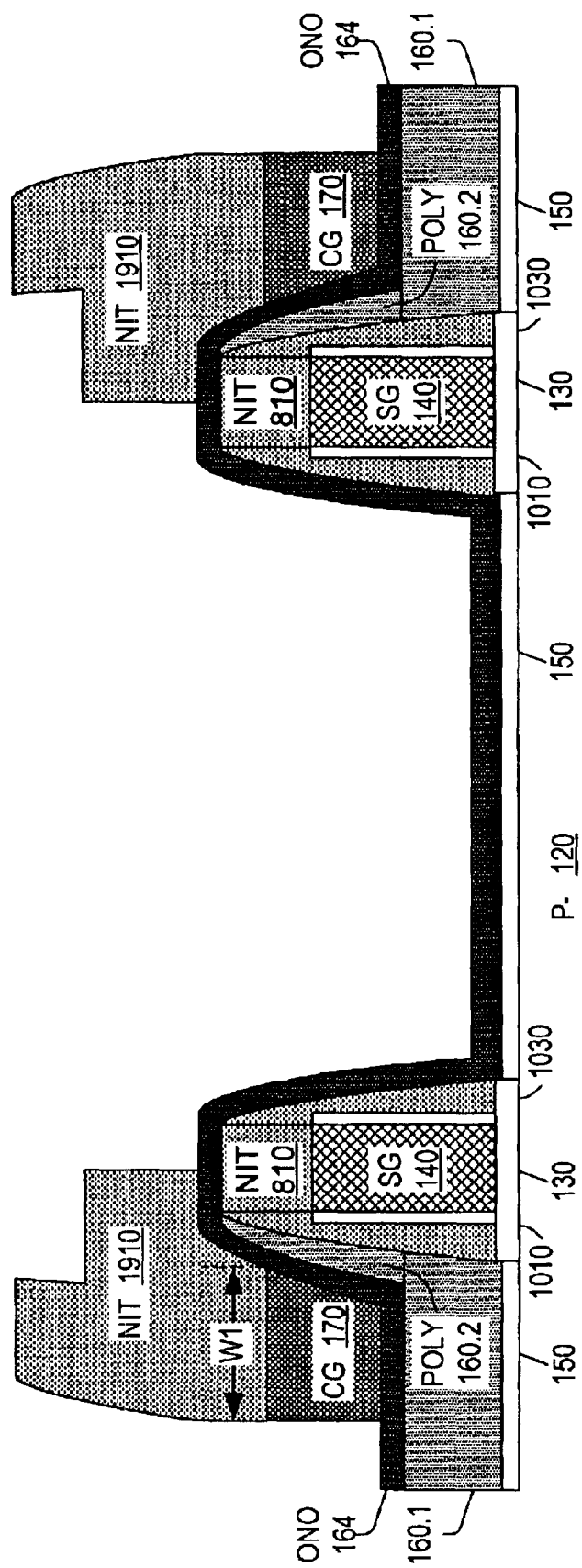
FIG. 25 (X-X')

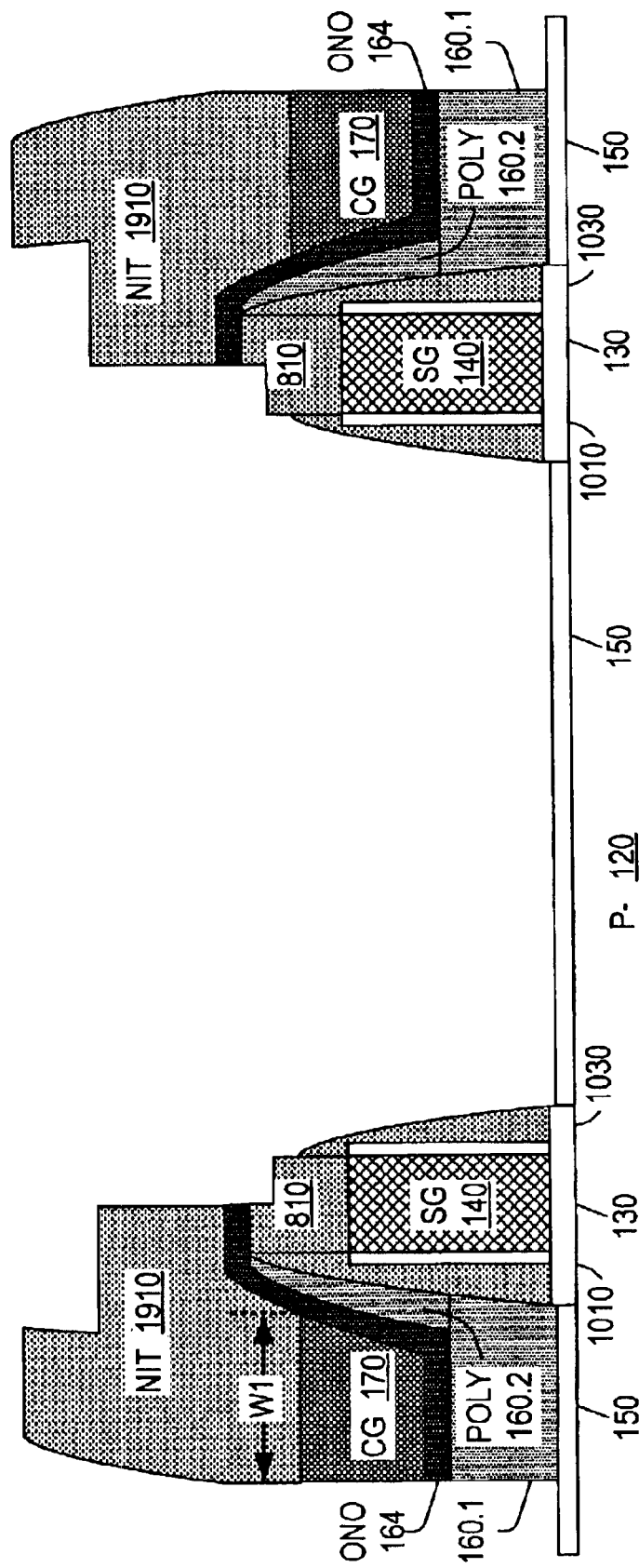
FIG. 26 (X-X')

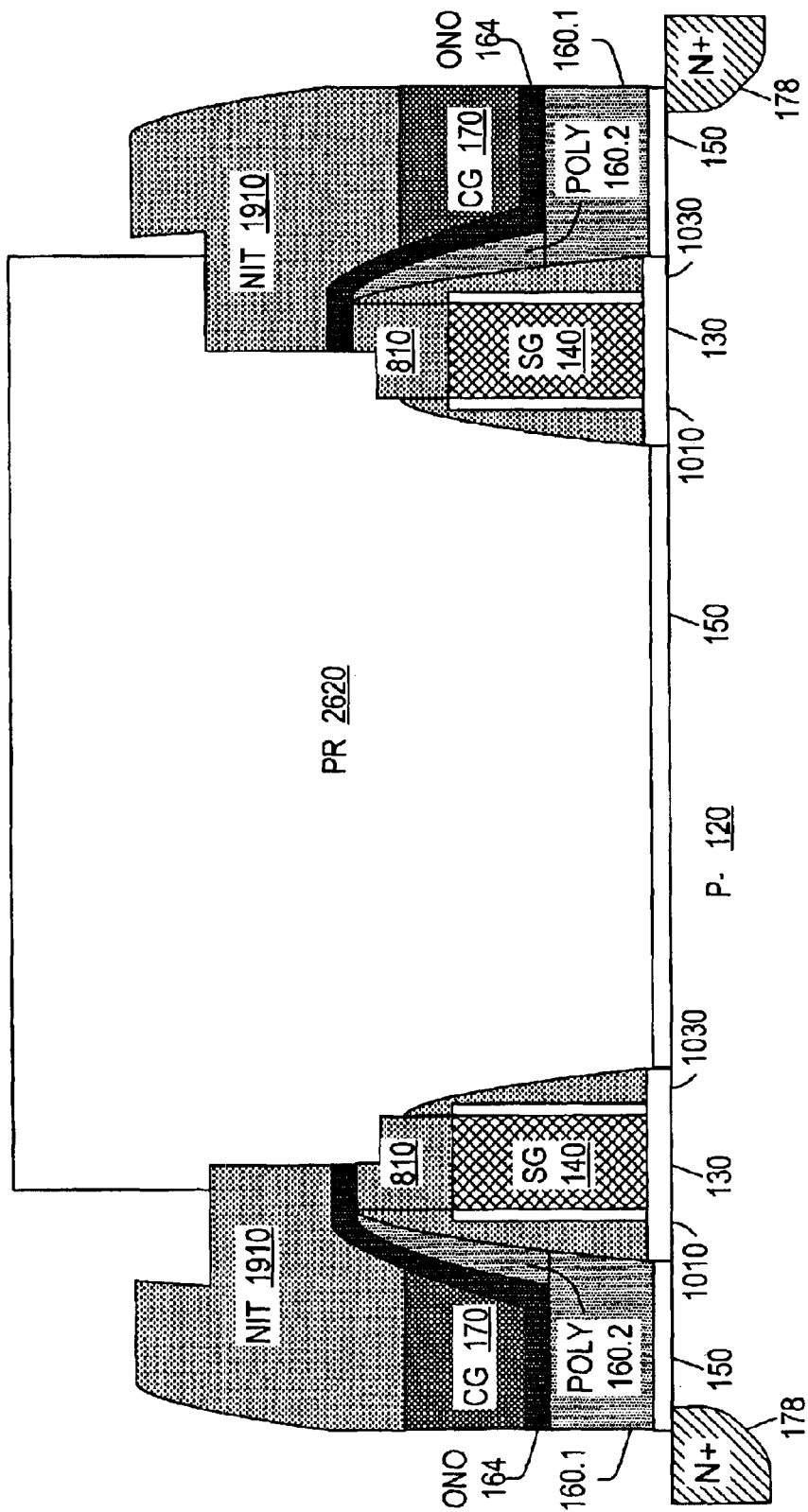
FIG. 27A (X-X')

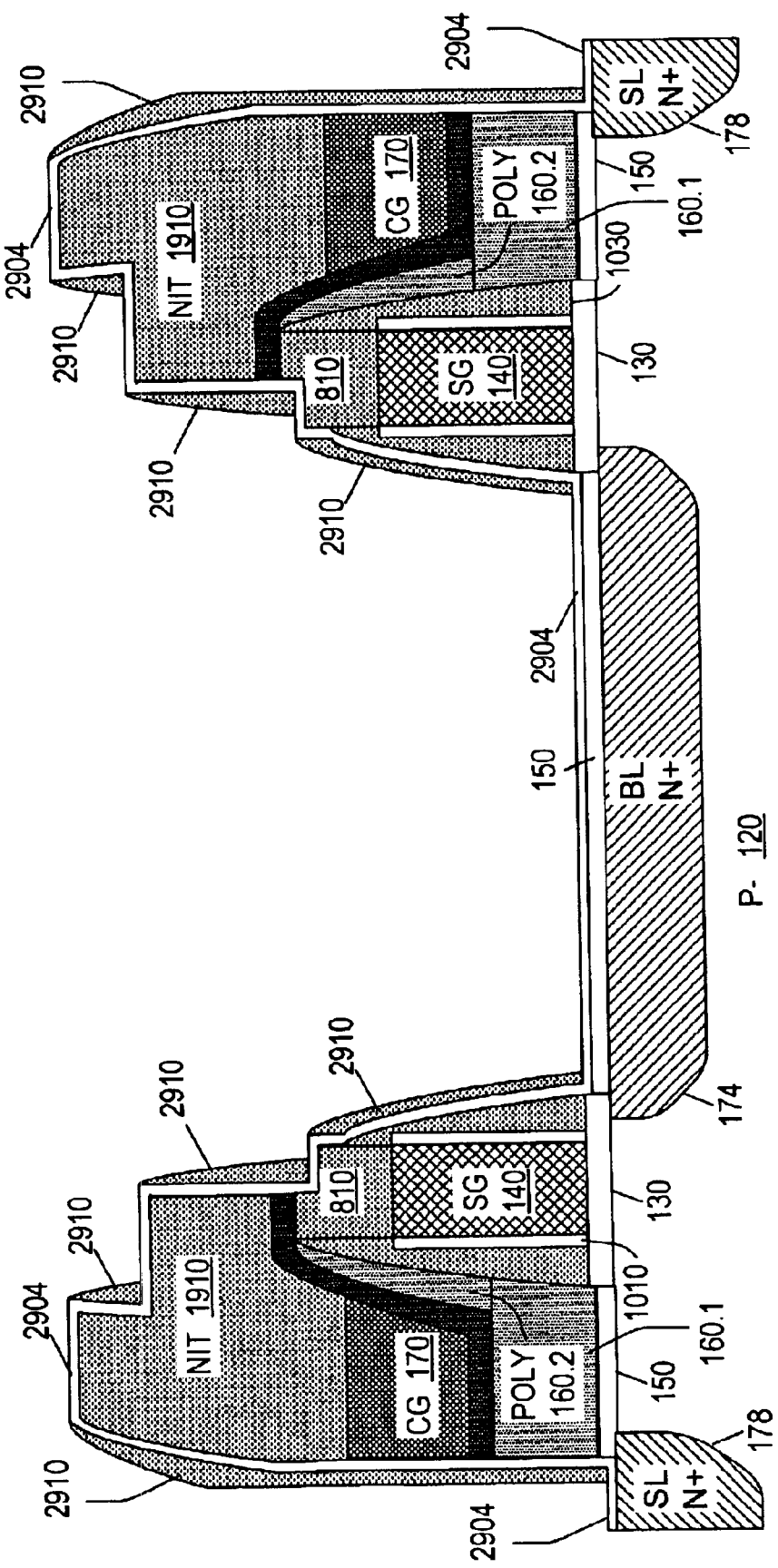
FIG. 28A (X-X')

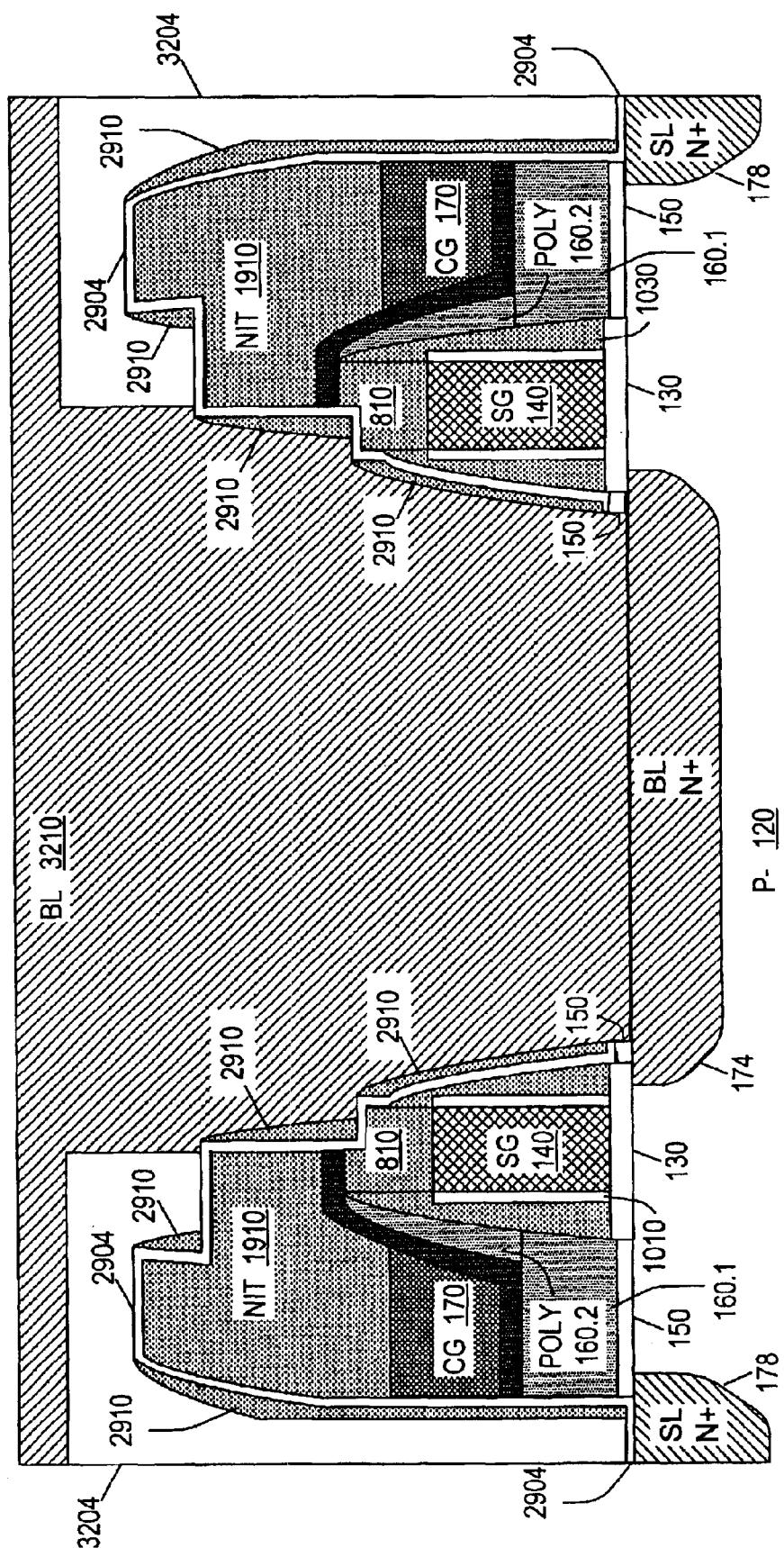
FIG. 29 (X-X')

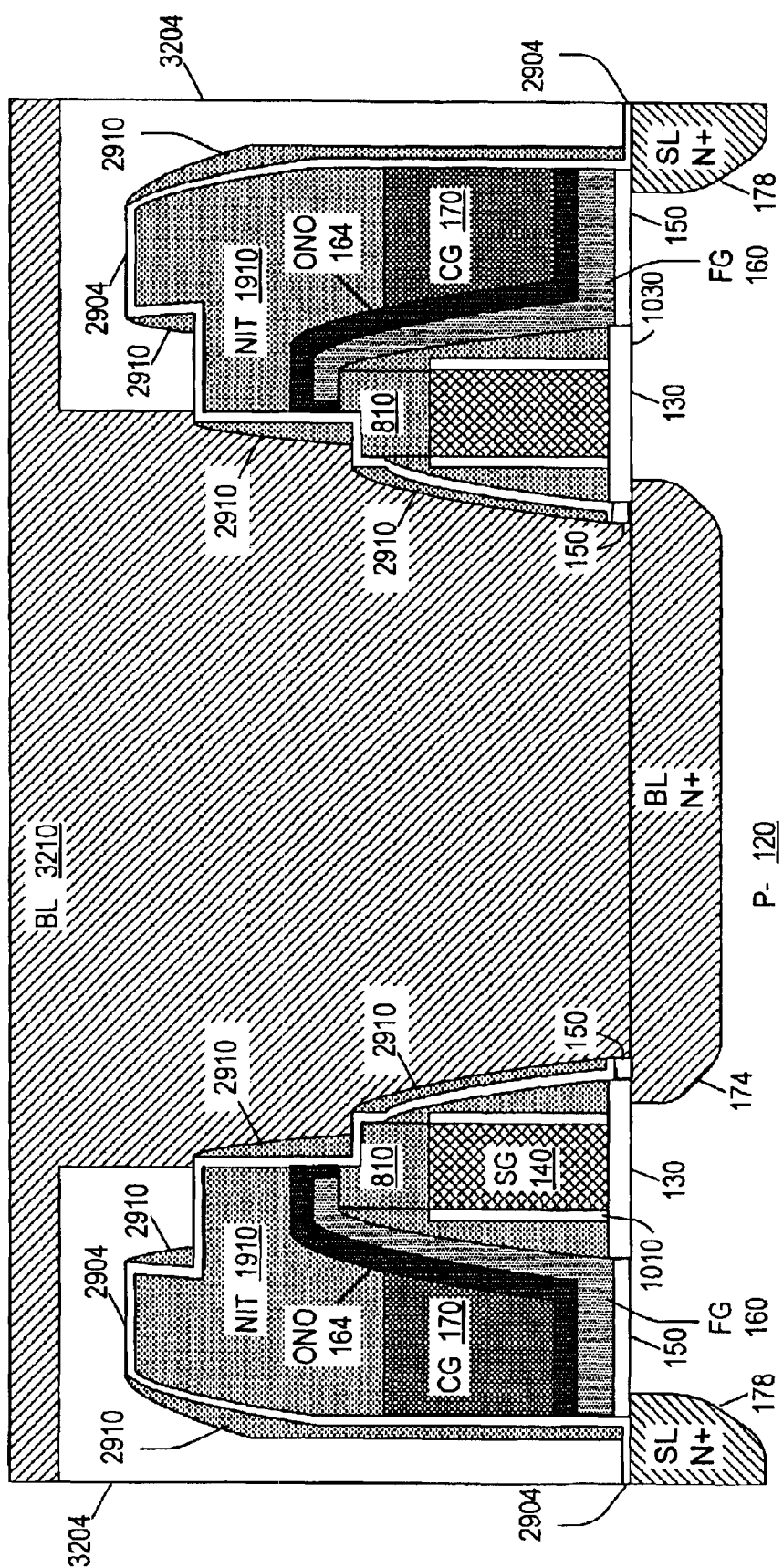
FIG. 36 (X-X')

NONVOLATILE MEMORIES WITH A FLOATING GATE HAVING AN UPWARD PROTRUSION

BACKGROUND OF THE INVENTION

The present invention relates to nonvolatile memories with conductive floating gates having an upward protrusion.

A nonvolatile memory cell with a conductive floating gate is operated by changing or sensing a charge on the floating gate. The charge on the floating gate is changed or sensed by means of inducing a voltage on the floating gate. This voltage is induced by means of the capacitive coupling between the floating gate and another gate (e.g. a control gate). In order to reduce the operating voltages in the memory cell, it is desirable to improve the gate coupling ratio which is the ratio of the capacitance between the two gates to the total capacitance associated with the floating gate.

FIG. 1 illustrates a flash memory cell described in U.S. Pat. No. 6,057,575 issued May 2, 2000 to Jenq. The cell is formed in and over a semiconductor substrate 120. Silicon dioxide 130 is thermally grown on substrate 120. Select gate 140 is formed on oxide 130. Silicon dioxide 150 is thermally grown on a region of substrate 120 not covered by the select gate. ONO 154 (a sandwich of a layer of silicon dioxide, a layer of silicon nitride, and a layer of silicon dioxide) is formed on select gate 140. Floating gate 160 is formed on dielectric layers 150 154. A portion of floating gate 160 overlies the select gate 140.

ONO layer 164 is formed on the floating and select gates. Control gate 170 is formed on ONO 164. The control gate overlies floating gate 160 and select gate 140.

N+ source and drain regions 174, 178 are formed in substrate 120.

Since the floating gate 160 and the control gate 170 extend over the select gate, the capacitance between the floating and control gates is increased without a corresponding increase in the cell area. The capacitance is increased both due to the horizontal portions of the floating and control gates over the select gate, and due to the vertical portions along the sidewall of the select gates.

In order to reduce the memory array and increase the memory packing density, it is desirable to fabricate the memory using self-aligned processes, i.e. processes less dependent on photolithography. The cell of FIG. 1 can be fabricated by a self-aligned process in which the left and right edges of floating gate 160 and control gate 170 are defined by a single photolithographic mask.

SUMMARY

This section summarizes some features of the invention. Other features are described in the subsequent sections. The invention is defined by the appended claims which are incorporated into this section by reference.

In some embodiments of the present invention, the floating gate is formed from two conductive layers. The second conductive layer provides an upward protrusion adjacent to the select gate. The second layer is formed after the first layer. The upward protrusion can be formed as a spacer overlaying a sidewall of the select gate.

In other embodiments, both the upward protrusion and the lower portion of the floating gate are formed from the same layer or layers.

In some embodiments, the control gates are formed from a control gate layer deposited over the floating gate layer and over the select gates. The control gate layer protrudes upward over the select gates. These protrusions are exploited to define the control gates in a self-aligned manner without photolithography.

In some embodiments, when the memory cell is viewed from the top, the distance between the floating gate spacer and the select gate is smaller than the width of the select gate.

In some embodiments, the control gate overlies a portion of the floating gate, but the top of the control gate is lower than the top of the floating gate.

Other features of the invention are described below. The invention is defined by the appended claims.

BRIEF DESCRIPTION OF THE DRAWINGS

FIGS. 4–8 show cross sections of the memory of FIGS. 3A, 3B in the process of fabrication.

FIGS. 10, 11, 12, 13A, 13B, 14, 15, 16A show cross sections of the memory of FIGS. 3A, 3B in the process of fabrication.

FIGS. 18–21, 22A show cross sections of the memory of FIGS. 3A, 3B in the process of fabrication.

FIGS. 23–26, 27A show cross sections of the memory of FIGS. 3A, 3B in the process of fabrication.

FIG. 28A shows a cross section of the memory of FIGS. 3A, 3B in the process of fabrication.

FIG. 29 shows a cross section of the memory of FIGS. 3A, 3B in the process of fabrication.

FIG. 36 shows a cross section of a memory according to one embodiment of the present invention.

DESCRIPTION OF SOME EMBODIMENTS

The embodiments described in this section illustrate but do not limit the invention. The invention is not limited to particular materials, process steps, or dimensions. The invention is defined by the appended claims.

Figure 1:
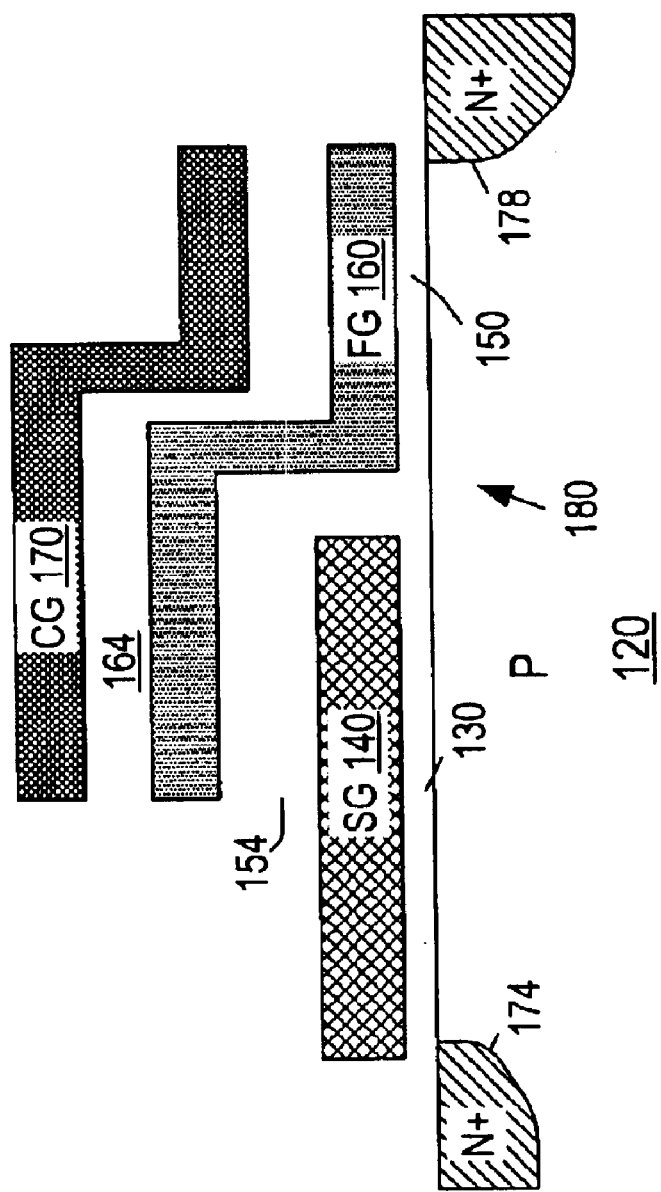
FIG. 1 shows a cross section of a prior art memory cell.
Figure 2A:
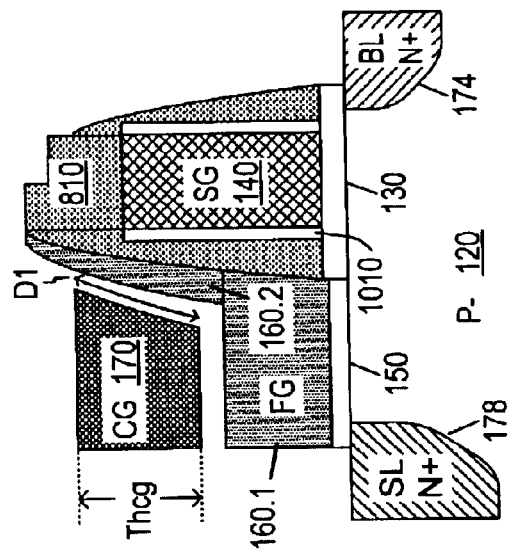
FIGS. 2A, 2B show cross sections of a memory cell according to one embodiment of the present invention.

FIG. 2A shows a cross section of a memory cell according to one embodiment of the present invention. The floating gate is formed from two layers 160.1, 160.2. Layer 160.1 is formed first. Then layer 160.2 is formed and etched to provide a spacer over a sidewall of select gate 140. In some embodiments, layer 160.2 is etched anisotropically without a mask over the memory cell.

We will sometimes refer to the combination of layers 160.1, 160.2 as layer 160. Layers 160.1, 160.2 can be thought of as sub-layers of layer 160.

Figure 2B:
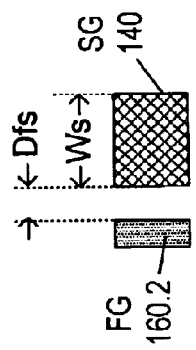

Dielectric 164 insulates the floating gate from control gate 170. FIG. 2B shows the memory cell cross section with dielectric 164 removed to emphasize the overlap D1 between the control gate 170 and spacer 160.2. This overlap increases the gate coupling ratio. The overlap D1 can be increased by increasing the thickness of control gate 170 and the overall thickness of the structure consisting of select gate 140 and dielectric 810 on top of the select gate. The gate coupling ratio can thus be increased without increasing the cell area. In FIGS. 2A, 2B, the overlap D1 is larger than the thickness Thcg of control gate 170 due to the inclined shape of the surface of spacer 160.2. In some embodiments, the overlap D1 is at least 0.08 μm.

Figure 2C:
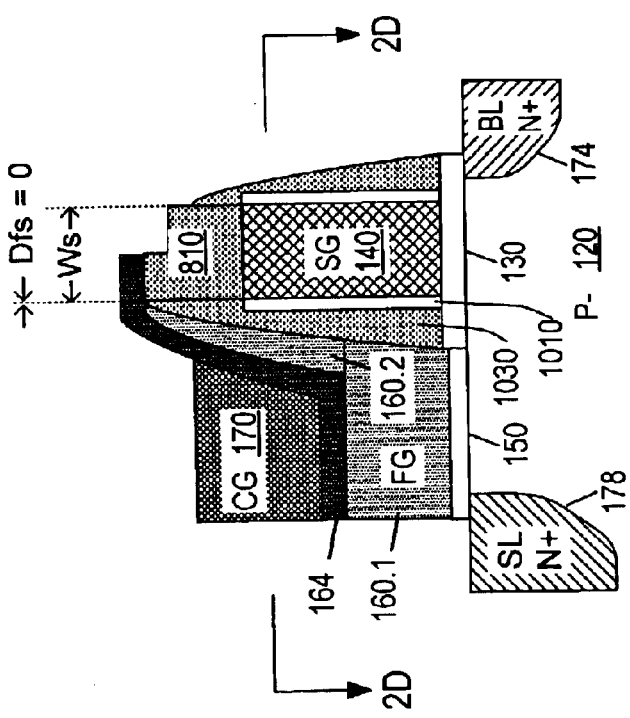
FIG. 2C is a top view of some features shown in FIG. 2A.

FIG. 2C is the top view of select gate 140 and floating gate spacer 160.2. The select gate width is shown as Ws. The distance between the spacer 160.2 and select gate 140 is marked Dfs. As seen in FIG. 2A, the top right corner of spacer 160.2 is directly above the left edge of select gate 140, so Dfs=0. In some embodiments, Dfs>0. In some embodiments, 0<Dfs<Ws.

Figure 2D:
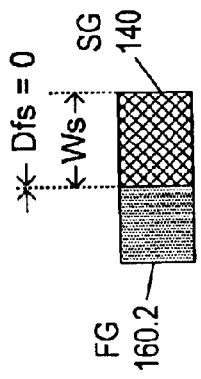
FIG. 2D shows a horizontal cross section of some features shown in FIG. 2A.

FIG. 2D shows a horizontal cross section along the line 2D—2D in FIG. 2A. In this cross section, the distance Dfs between the spacer 160.2 and select gate 140 is determined by the thickness of dielectric layers 1010, 1030 which overlay the sidewall of select gate 140. Formation of these layers is described below. In some embodiments, Dfs is smaller than Ws in this cross section, as well as in any horizontal cross section by a plane passing through the select gate 140 and the spacer 160.2. In one embodiment, the minimum feature size is 0.18 μm, Ws=0.18 μm, and Dfs is in the range of 0 to 250 Å. The invention is not limited to these dimensions and relationships.

In FIG. 2A, control gate 170 overlies the portion 160.1 of the floating gate, but the top of control gate 170 is lower than the top of spacer 160.2. In other embodiments, the top of control gate 170 is at the same level as the top of spacer 160.2, or is higher than the top of spacer 160.2. Also, in FIG. 2A, the top of spacer 160.2 is higher than the select gate 140, but in other embodiments the top of spacer 160.2 is at the same level as, or lower than, the top of select gate 140.

Figure 3A:
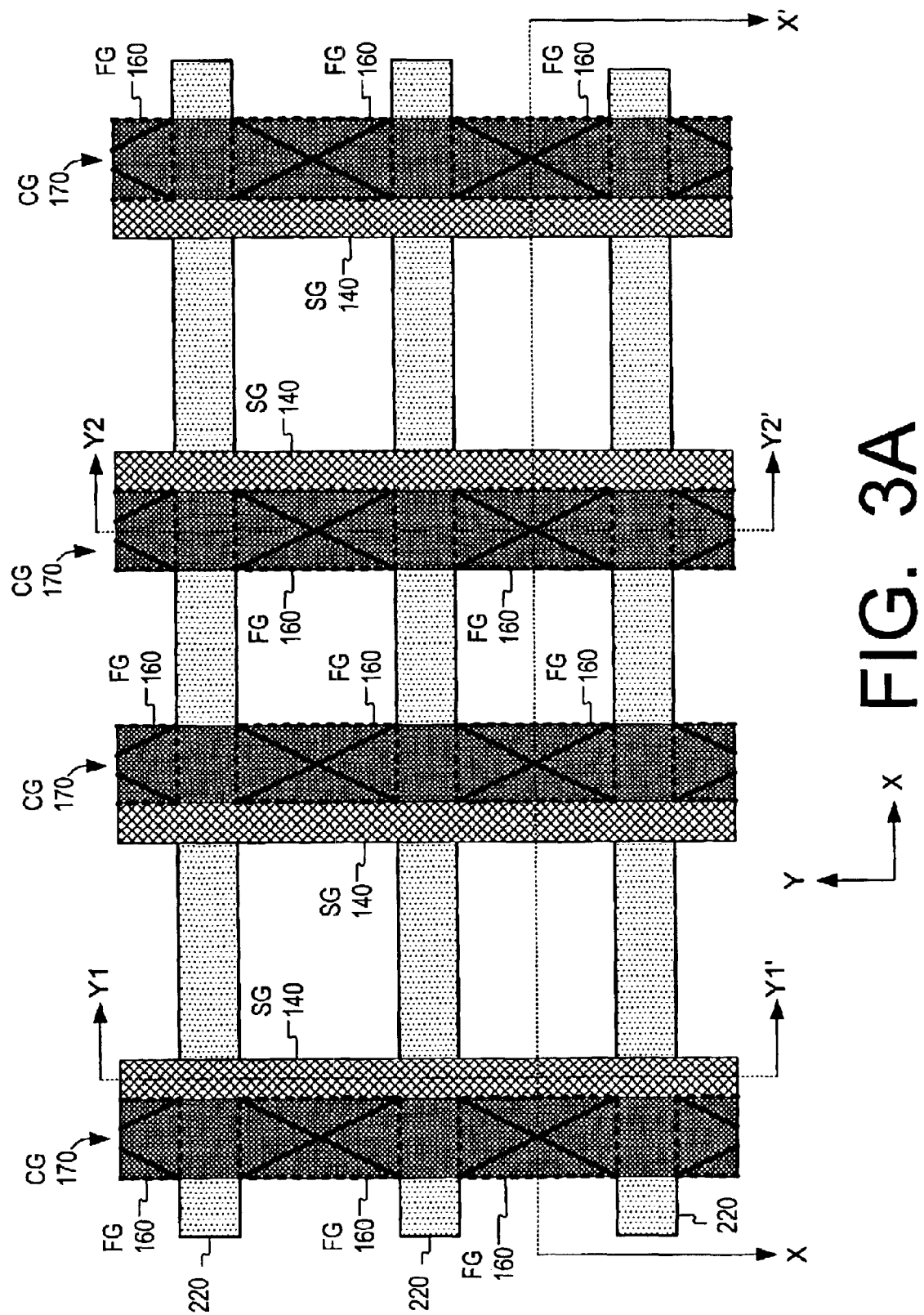
FIG. 3A is a top view of an intermediate structure obtained in the fabrication of a memory according to one embodiment of the present invention.
Figure 3B:
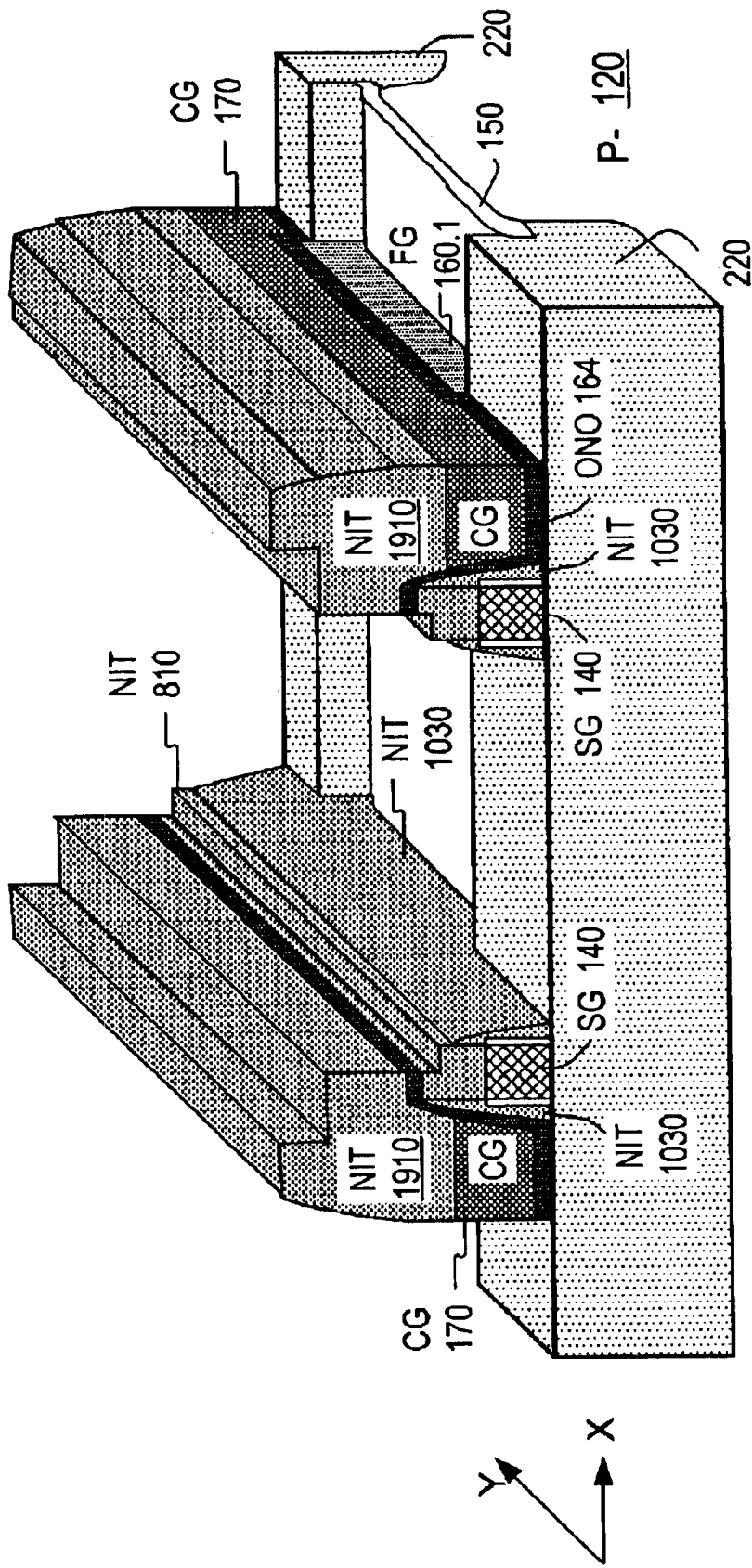
FIG. 3B is a perspective view of the memory of FIG. 3A in the process of fabrication.

As exemplary fabrication process will now be illustrated on the example of a flash memory array shown in FIGS. 3A, 3B. FIG. 3A is a top view showing some features of the array. FIG. 3B is a perspective view showing additional features. Each memory cell includes a floating gate 160 made from layers 160.1, 160.2, a control gate 170, and a select gate 140. The floating, control and select gates are insulated from each other and from semiconductor substrate 120 (e.g. monocrystalline silicon). Each control gate 170 is part of a control gate line, also referenced by numeral 170, that extends in the Y direction across the array. In some embodiments, the Y direction is a row direction, and each control gate line 170 provides the control gates for one row of the memory cells. Different control gate lines 170 may or may not be electrically tied together. Floating gates 160 underlie the control gates. The position of each floating gate 160 is shown with a cross in FIG. 3A. Each select gate 140 is part of a select gate line, also referenced at 140, extending across the array in the Y direction. Substrate isolation regions 220 (field isolation regions) extend in the X direction. In some embodiments, the X direction is the column (bitline) direction. Each region 220 traverses the entire array. Each select gate line 140 and each control gate line 170 crosses over all of the regions 220.

Subsequent figures illustrate vertical cross sections of intermediate structures obtained during the memory fabrication. The sectional planes are indicated in FIG. 3A by lines X-X', Y1-Y1', and Y2-Y2'. The line X-X' passes in the X direction between substrate isolation regions 220. The line Y1-Y1' passes in the Y direction through a select gate line 140. The line Y2-Y2' passes in the Y direction through a control gate line 170.

In one embodiment, the memory is fabricated as follows. Substrate isolation regions 220 are formed in P doped substrate 120 by shallow trench isolation ("STI") technology. More particularly, as shown in FIG. 4 (the Y1-Y1' cross section), a silicon dioxide layer 410 (pad oxide) is formed on substrate 120 by thermal oxidation or some other technique. Silicon nitride 420 is deposited on oxide 410. Nitride 420 is patterned photolithographically, using a photoresist mask (not shown), to define isolation trenches 220T. Oxide 410 and substrate 120 are etched through the openings in nitride 420. Trenches 220T are formed in the substrate as a result. Each trench 220T traverses the entire memory array in the X direction.

Nitride 420 is subjected to a timed wet etch to recess the vertical edges of the nitride layer away from trenches 220T. See FIG. 5 (cross section Y1-Y1'). Oxide 410 is also recessed away from the trenches in this step.

A thin layer 220.1 of silicon dioxide is thermally grown on the exposed silicon surfaces to round the edges of trenches 220T. Then silicon dioxide 220.2 is deposited using a high density plasma technique (HDP). Oxide 220.2 fills the trenches and initially covers the nitride 420. Oxide 220.2 is polished by chemical mechanical polishing (CMP). The polishing stops on nitride 420. A planar top surface is provided.

In the subsequent figures and FIGS. 3A and 3B, the layers 220.1, 220.2 are shown as a single layer 220.

As shown in FIG. 5, oxide 220 protrudes above the substrate 120 by an amount equal to the combined thickness of nitride 420 and oxide 410. The protruding portions of oxide 220 are shown at 220P.

Nitride 420 is removed selectively to oxide 220 (FIG. 6, cross section Y1-Y1'). This can be done by a wet etch (e.g. with phosphoric acid).

Dopant is implanted into substrate 120 to form an N type region 604 underlying the memory array. Dopant is also implanted into the substrate around the array to form an N type region (not shown) extending from the top surface of substrate 120 down to region 604. These implants create a fully isolated P well 120W for the memory array. Region 604 is not shown in the subsequent drawings.

Oxide 220 is subjected to an etch (FIG. 7, cross section Y1-Y1'). The etch includes a horizontal component that causes the sidewalls of oxide 220 to be laterally recessed away from active areas 710 (the substrate areas not occupied by trenches 220T). The etch can be an isotropic wet etch. This etch will result in improved capacitive coupling between the floating and control gates. See U.S. patent application No. 10/262,785 filed Oct. 1, 2002 by Yi Ding and incorporated herein by reference.

Portions 220P of oxide 220 are not etched away, and they continue to protrude above the top surface of substrate 120. An exemplary final thickness of the protruding portions 220P is 0.08 $\mu$m for a 0.18 $\mu$m fabrication process (a process with a 0.18 $\mu$m minimum line width). The exemplary dimensions given in this section assume a 0.18 $\mu$m fabrication process unless mentioned otherwise.

Pad oxide 410 is removed during the etch of oxide 220.

Silicon dioxide 130 is thermally grown on the exposed areas of substrate 120 to provide gate dielectric for the select transistors. An exemplary thickness of oxide 130 is 120 Å. Generally, the oxide thickness depends on the maximum voltage that the oxide 130 is designed to sustain during the memory operation.

As shown in FIG. 8 (cross section Y1-Y1'), a conductive polysilicon layer 140 is formed over the structure by a conformal deposition process (e.g. low pressure chemical vapor deposition, "LPCVD"). Polysilicon 140 fills the spaces between the oxide protrusions 220P in the memory array area. The top polysilicon surface is planar because the polysilicon portions deposited on the sidewalls of protrusions 220P meet together.

Non-conformal deposition processes, whether known or to be invented, can also be used. If the top surface of polysilicon 140 is not planar, it is believed that the polysilicon 140 can be planarized after the deposition using known techniques (e.g. CMP, or spinning a photoresist layer over the polysilicon 140 and then simultaneously etching the resist and the polysilicon at equal etch rates until all of the photoresist is removed). The bottom surface of polysilicon 140 is non-planar as it goes up and down over the oxide protrusions 220P.

An exemplary final thickness of polysilicon 140 is 0.06 $\mu$m over the active areas.

Silicon nitride 810 is deposited on polysilicon 140, by LPCVD for example, to an exemplary thickness of 1500 Å. If desired, a pad oxide layer (not shown) can be formed on polysilicon 140 before the nitride deposition. The pad oxide layer will provide an additional protection for the select gates during the etch of control gate polysilicon 170 described below in connection with FIG. 21.

In some embodiments, the top surface of polysilicon 140 and/or nitride 810 is not planar.

Figure 9:
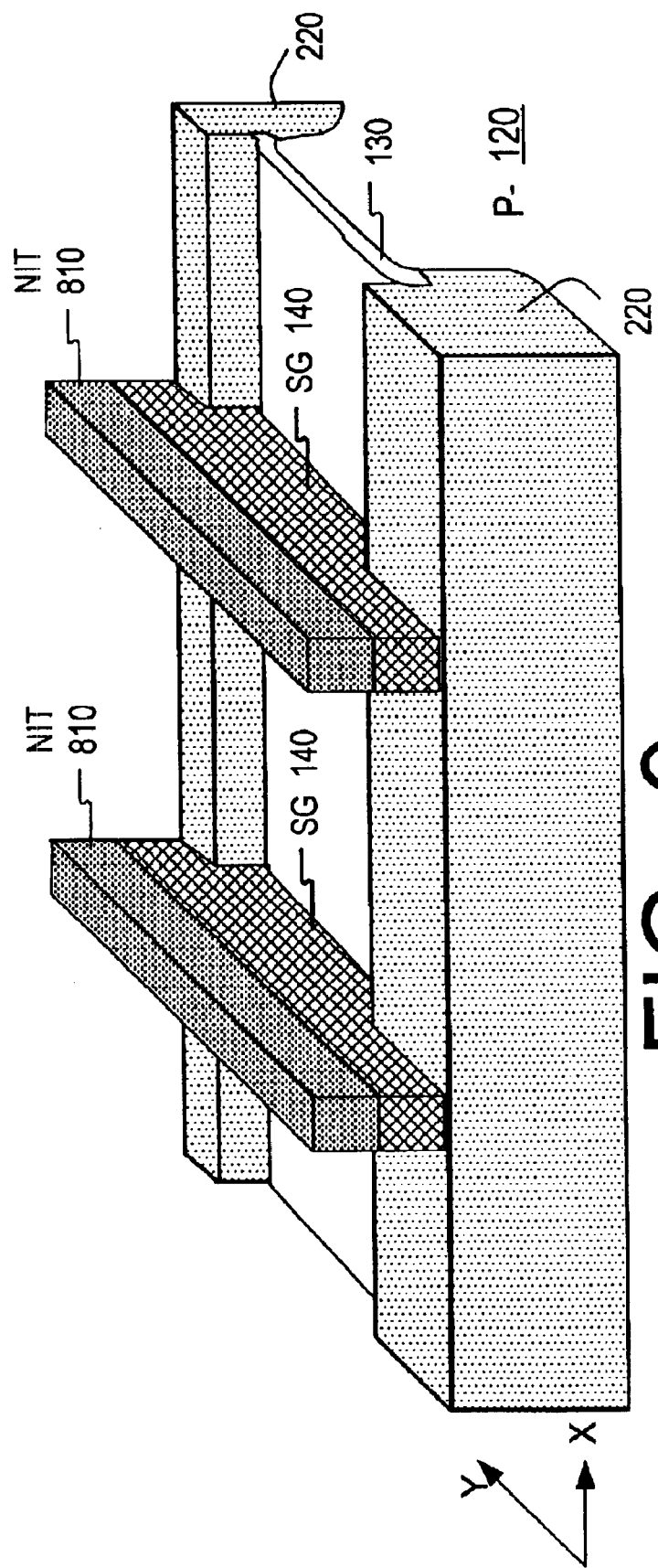
FIG. 9 is a perspective view of the memory of FIGS. 3A, 3B in the process of fabrication.

The wafer is coated with a photoresist layer (not shown). The resist is patterned to define select gate lines 140. See FIG. 3A, and see also the perspective view in FIG. 9. Each select gate line 140 extends in the Y direction through the entire array. The memory array geometry is not sensitive to a misalignment between the mask defining the lines 140 and the mask defining the isolation trenches 220T (FIG. 4) except possibly at the boundary of the memory array.

Silicon nitride 810 is etched through the resist openings. The resist is removed, and polysilicon 140 is etched away where exposed by nitride 810. Select gate lines 140 are formed as a result. (In an alternative embodiment, the resist defining the nitride 810 is removed after the etch of polysilicon 140.)

As shown in FIG. 10 (cross section X-X'), the structure is oxidized to grow silicon dioxide 1010 on the sidewalls of select gate lines 140. Then a thin conformal silicon nitride layer 1030 is deposited and etched anisotropically, without a mask over the memory array, to form spacers on the sidewalls of each structure consisting of a select gate line 140, the overlying nitride 810, and the sidewall oxide 1010. Formation of silicon nitride spacers is described, for example, in U.S. Pat. No. 6,355,524 issued Mar. 12, 2002 to H. Tuan et al. and incorporated herein by reference.

A blanket oxide etch removes the exposed portions of silicon dioxide 130. Silicon dioxide 150 (FIG. 11, cross section X-X') is thermally grown on substrate 120 to a desired thickness, e.g. 90 Å.

First floating gate polysilicon layer 160.1 is deposited over the structure, by LPCVD for example, and is doped during or after the deposition. Polysilicon 160.1 is sufficiently thick to ensure that the top surface of layer 160.1 is at least as high as the top surface of nitride 810. In particular, the top surface of polysilicon 160.1 includes regions 160T between the select gates 140. Regions 160T are at least as high as the top surface of nitride 810.

Layer 160.1 is planarized by a CMP process that stops on nitride 810, or by some other process. See FIG. 12 (cross section X-X'). The top surface of polysilicon 160.1 becomes coplanar with the top surface of nitride 810. CMP processes and slurries are known that allow one to avoid dishing at the top surface of the polysilicon layer.

Then polysilicon 160.1 is etched. Layer 160.1 is not masked in the memory array area. See FIGS. 13A (cross section X-X') and 13B (cross section Y2-Y2'). The etch stops when trench oxide 220 becomes exposed. A suitable overetch is performed to completely remove the polysilicon 160.1 from the top surface of oxide 220. In some embodiments, the final thickness of layer 160.1 is 800 Å to 1200 Å.

Optionally, a timed etch of oxide 220 is performed to recess the top surface of oxide 220 below the surface of polysilicon 160.1. See FIG. 14 (cross section Y2-Y2'). This etch will improve the capacitive coupling between the floating and control gates. See the aforementioned U.S. Pat. No. 6,355,524. In the embodiment of FIG. 14, the oxide 220 continues to protrude above the top surface of substrate 120, as shown at 220P, by about 0.06 $\mu$m to 0.10 $\mu$m. In other embodiments, the oxide 220 does not protrude above the substrate after the etch.

Second polysilicon layer 160.2 (FIG. 15) is deposited over the structure. This is a conductive layer, doped during or after deposition to the same conductivity type as layer 160.1. Layer 160.2 is conformal. An exemplary deposition process if LPCVD. An exemplary thickness is 1200 Å.

Figure 16B:
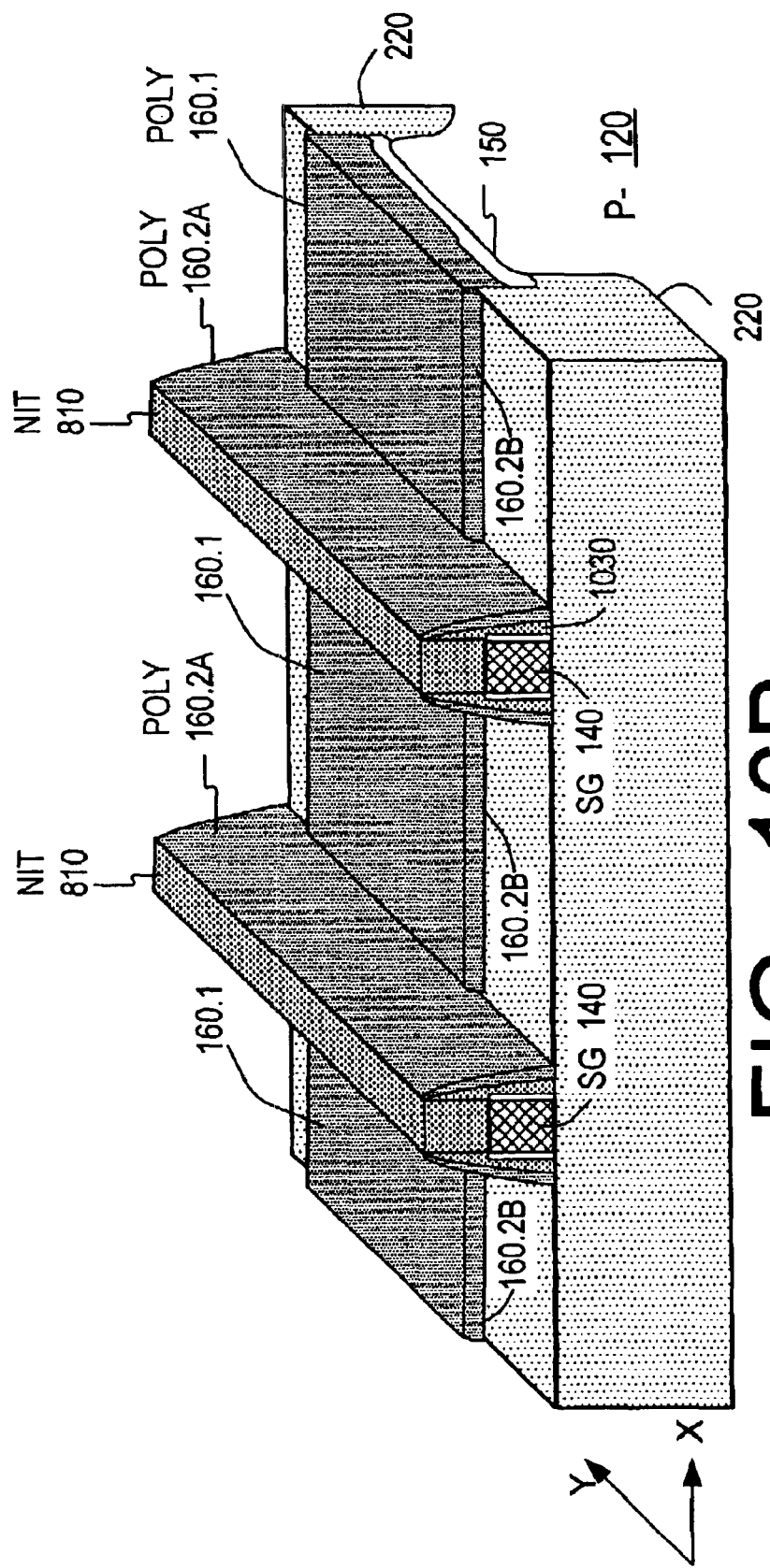
FIG. 16B is a perspective view of the memory of FIGS. 3A, 3B in the process of fabrication.

Polysilicon 160.2 is etched anisotropically, without a mask over the memory array, to form polysilicon spacers 106.2A over dielectric sidewalls 1030. See FIG. 16A (cross section X-X') and FIG. 16B (perspective view). The horizontal etch rate may or may not be zero but it is lower than the vertical etch rate. The etch end point is the exposure of nitride 810 and/or trench oxide 220. Due to the etch of oxide 220 described above in connection with FIG. 14 (the etch that recessed the top surface of oxide 220 below the surface of polysilicon 160.1), the etch of polysilicon 160.2 may also form spacers 160.2B (FIG. 16B) on the sidewalls of polysilicon 160.1 near the active areas.

Figure 17A:
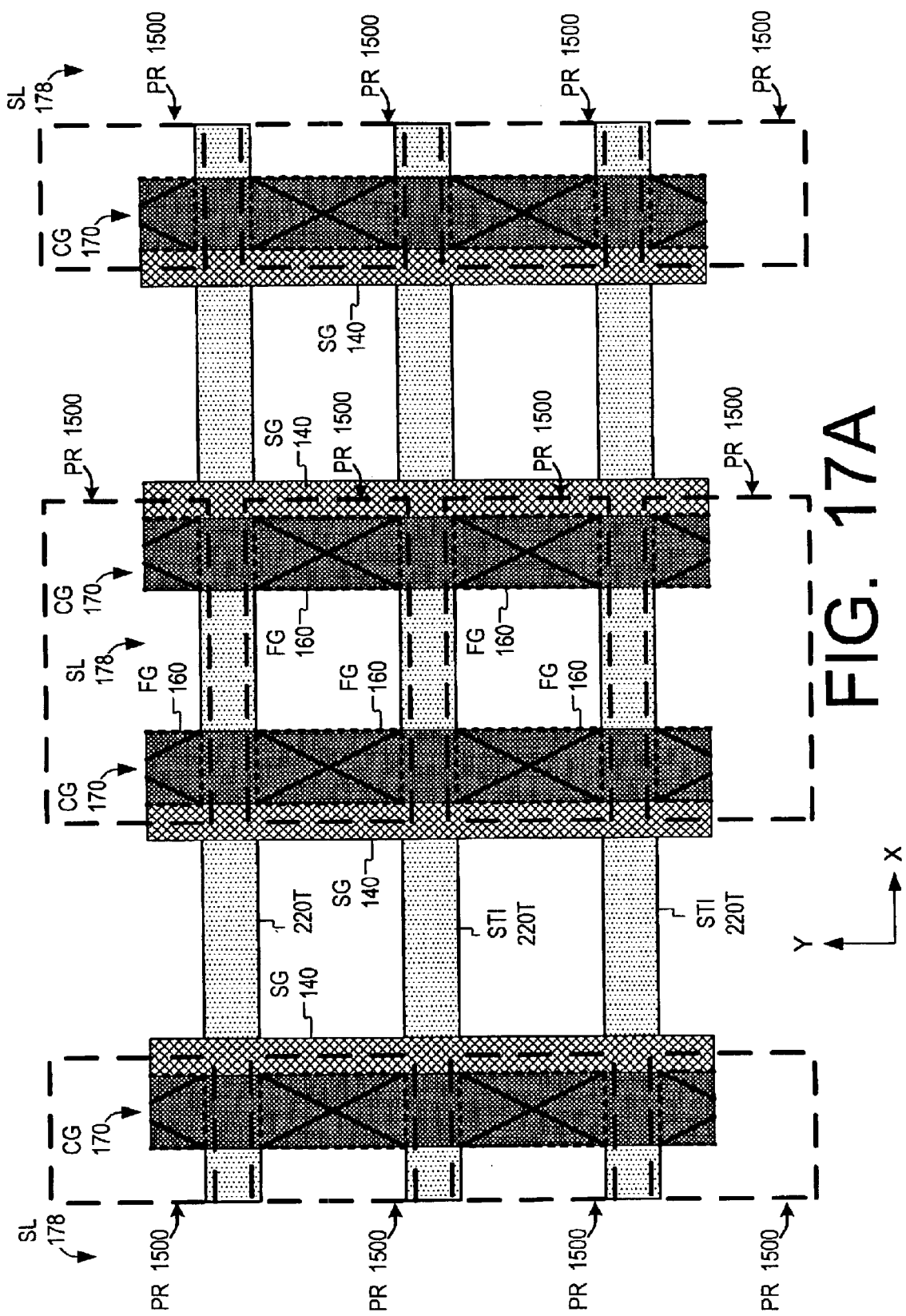
FIG. 17A is a top view of the memory of FIGS. 3A, 3B in the process of fabrication.

A photoresist mask 1500 (FIG. 17A, top view) is formed over the memory array to protect portions of polysilicon 160.2. FIG. 17A illustrates the position of mask 1500 with respect to the elements shown in FIG. 3A. The mask is patterned to form a number of rectangular photoresist features. Each of these features of resist 1500 extends over an active area between two adjacent trenches 200T. The resist feature covers the future positions of a source line region 178 and two control gate lines 170 between adjacent select gate lines 140. The mask edges extending in the X direction are positioned over trenches 220T. The mask edges extending in the Y direction can be positioned anywhere over select gate lines 140. Thus, all of the edges of the mask openings in the memory array area are positioned over the select gate lines 140 and/or trenches 220T.

Figure 17B:
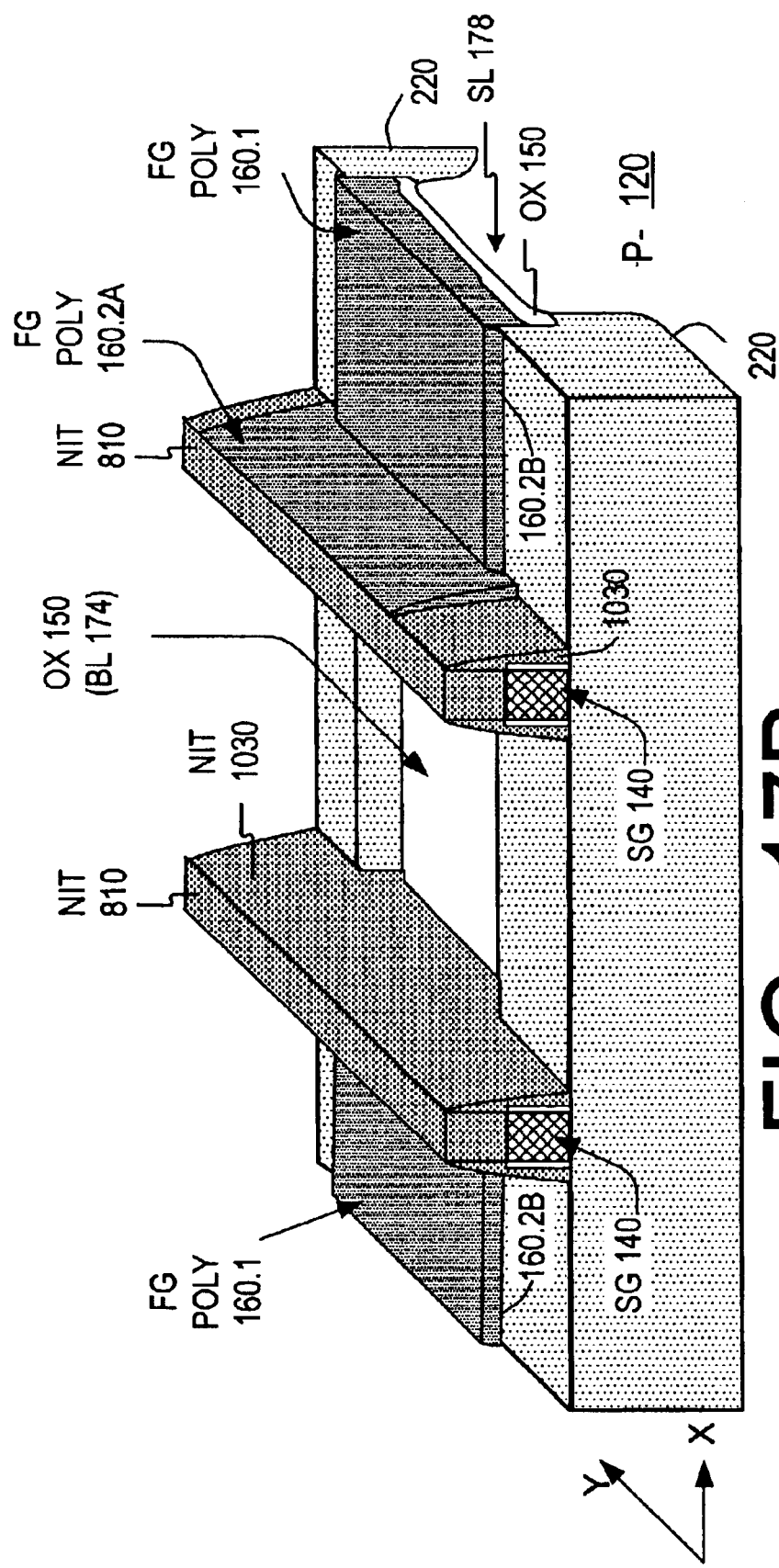
FIG. 17B is a perspective view of the memory of FIGS. 3A, 3B in the process of fabrication.

Polysilicon layers 160.2, 160.1 are etched away in the areas exposed by resist 1500. The resulting structure is shown in FIG. 17B. Polysilicon 160.1, 160.2 is completely removed between adjacent select gate lines 140 over the future positions of bitline regions 174. Oxide 150 becomes exposed in these areas. In the areas of future positions of source line regions 178 and control gate lines 170, polysilicon 160.1 is not etched at all. Portions of polysilicon spacers 160.2A are etched away over the isolation trenches 220T. The remaining portions of spacers 160.2A each form an upward protrusion for the floating gate for one memory cell over a sidewall of select gate line 140.

In the embodiment of FIG. 17B, the resist 1500 covers the spacers 160.2B. Therefore, these spacers are not removed.

If the mask 1500 is shifted in the Y direction, the spacers 160.2B will not be affected as long as they are protected by the mask. The spacers 160.2A will be shifted in the Y direction, but the length of each spacer 160.2A in the Y direction will remain unchanged. The shift of spacers 160.2A is not believed to have a significant effect on the electrical properties of the memory cells.

Spacers 160.2A are marked simply as 160.2 in the subsequent figures.

ONO layer 164 (FIG. 18, cross section X-X') is formed over the structure. Control gate polysilicon layer 170 is deposited on ONO 164 and is doped during or after the deposition.

The top surface of polysilicon 170 is not planar. Layer 170 has a protruding portion 170.1 over each select gate line 140. The protrusions 170.1 will be used to define the control and floating gates without additional dependence on photolithographic alignment.

As shown in FIG. 18, cavities 170C form in layer 170 between protrusions 170.1. As shown in FIG. 19 (cross section X-X'), these cavities are filled with some material 1710. In one embodiment, material 1710 is silicon dioxide deposited on polysilicon 170 and planarized by CMP or some other process. The memory array area has a planar top surface, with polysilicon 170 exposed.

Polysilicon 170 is etched without a mask selectively to oxide 1710. See FIG. 20 (cross section X-X'). This etch attacks the polysilicon portions 170.1 and creates cavities 1810 in the top surface of the structure. Polysilicon 170 is recessed relative to oxide 1710 in these cavities. In the embodiment of FIG. 20, this etch exposes ONO 164, and continues for some time to recess the top surface of polysilicon 170 below the top surface of ONO 164. This is not necessary however. The polysilicon etch can stop before exposing the ONO 164, or the etch can stop when the ONO layer becomes exposed. If ONO 164 is exposed, the width W1 of the polysilicon layer 170 in cavities 1810 on a side of select gate 140 will define the width of the control and floating gates in a self-aligned manner as will be illustrated below.

In some embodiments, the minimum thickness of polysilicon 170 (at the bottom of cavities 1810) is 0.18 μm, and the width W1 is less than 0.18 μm. In FIG. 20, the top surface of polysilicon 170 is recessed in cavities 1810. In another embodiment, polysilicon 170 has a planar top surface throughout the memory array area.

A protective material is deposited into cavities 1810 to protect the polysilicon 170 portions near the select gates 140. In one embodiment, this material is silicon nitride 1910 (see FIG. 21, cross section X-X'). Nitride 1910 is deposited over the structure and polished by CMP until the oxide 1710 is exposed in the memory array area. See FIG. 22A (cross section X-X'). Nitride 1910 remains in cavities 1810.

Instead of CMP, the nitride 1910 can be processed by depositing a layer of material (not shown) having a planar top surface, and etching that material and the nitride with equal etch rates until the oxide 1710 is exposed. The material can be photoresist. The material can be removed after the nitride etch.

An antireflective coating layer (ARC) 2010, shown in FIG. 22A, is flowed on nitride 1910 and cured. The structure has a planar top surface after this step.

Figure 22B:
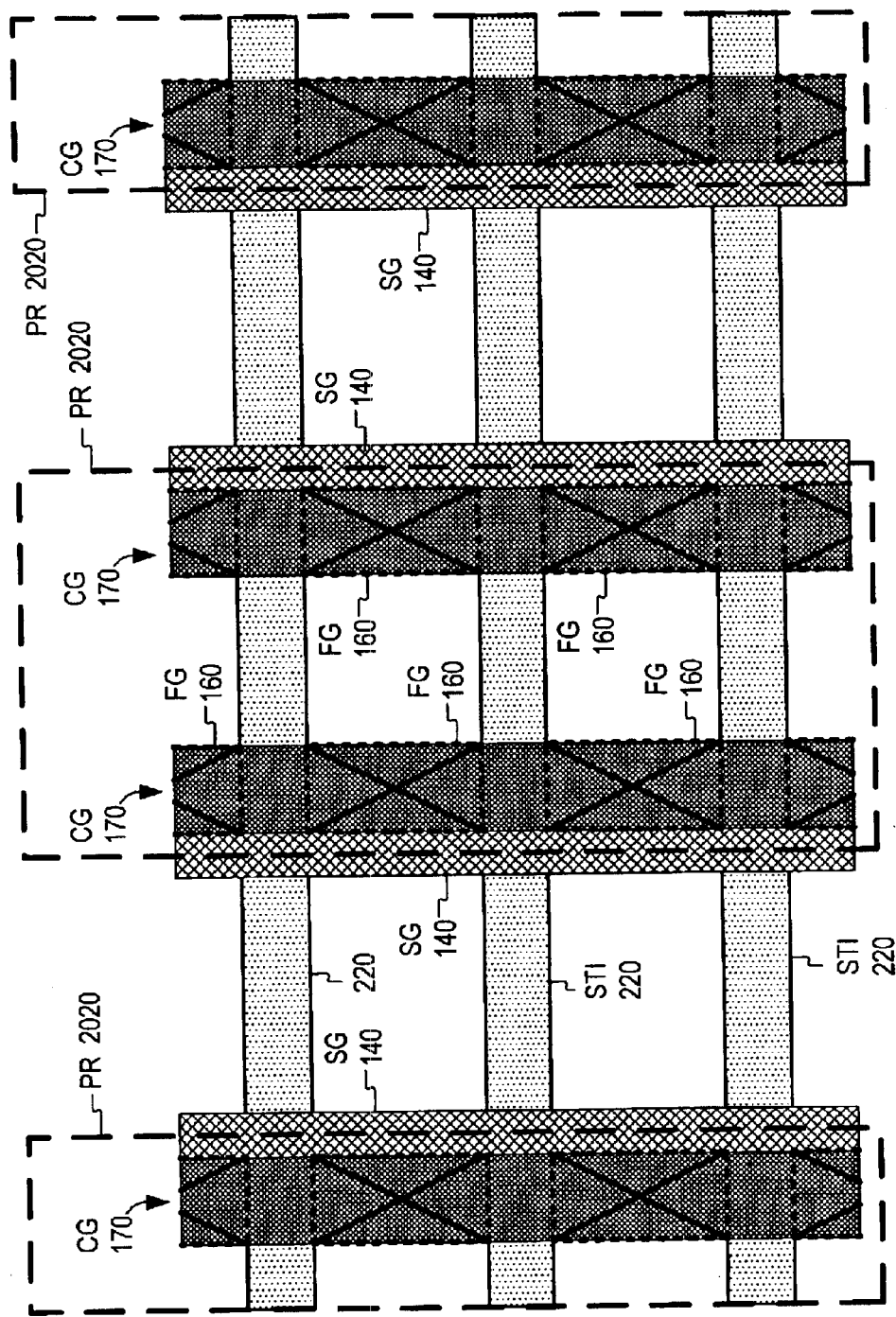
FIG. 22B is a top view of the memory of FIGS. 3A, 3B in the process of fabrication.

The wafer is coated with a photoresist layer 2020. The resist is patterned to protect the portion of nitride 1910 on one side of each select gate line 140. FIG. 22B (top view) illustrates the position of mask 2020 with respect to the features shown in FIG. 3A. Resist 2020 overlies the future positions of control gate lines 170, and exposes those areas between the adjacent select gate lines 140 in which the control gate polysilicon 170 will be removed. The longitudinal edges of mask 2020 can be located anywhere over the select gate lines 140.

Silicon nitride 1910 and ARC 2010 are etched away where exposed by resist 2020. Resist 2020 and the remaining portions of ARC 2010 are then removed. The resulting memory array structure is shown in FIG. 23 (cross section X-X'). Nitride 1910 protects the polysilicon 170 portions of the width W1 (FIGS. 20, 23) at the bottom of cavities 1810.

Oxide 1710 is etched away by a blanket etch. The resulting structure is shown in FIG. 24 (cross section X-X').

Polysilicon 170 is etched in the array area with nitride 1910 as a mask. The etch is selective to silicon dioxide, so the etch stops on ONO 164. The resulting structure is shown in FIG. 25 (cross section X-X').

ONO 164 and polysilicon 160.1 are etched with nitride 1910 as a mask. Layers 164, 160.1 are completely removed from the areas not covered by nitride 1910. See FIG. 26 (cross section X-X'). Nitride layers 1910, 810, 1030 and oxide 150 can be partially removed during the etch of ONO 164. Floating gates 160 and control gate lines 170 are fully defined at the conclusion of this step, and are as in FIGS. 3A and 3B. The width of the top surface of control gate line 170 is W1, defined as described above in connection with FIG. 20.

Figure 27B:
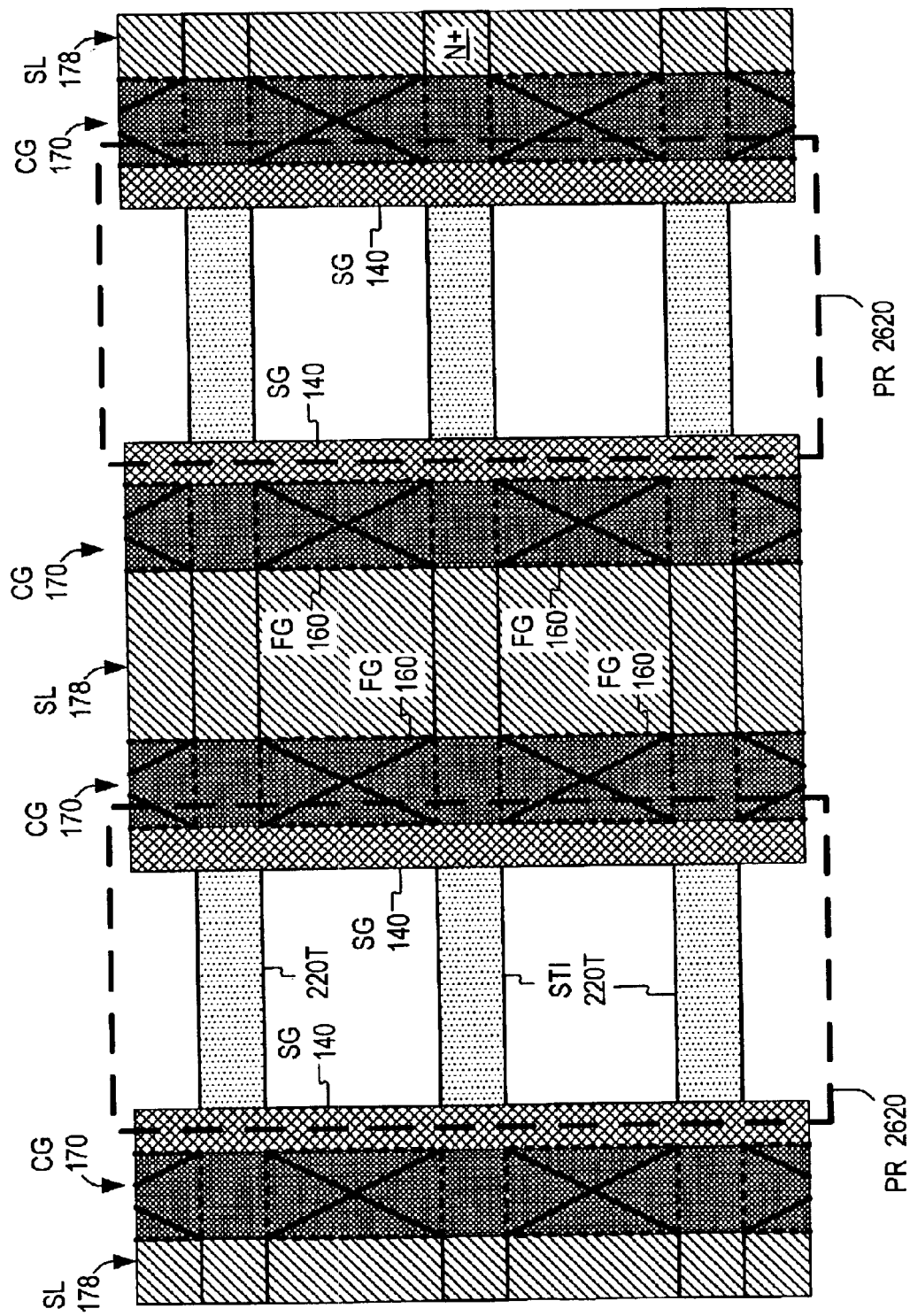
FIG. 27B is a top view of the memory of FIGS. 3A, 3B in the process of fabrication.

The wafer is coated with photoresist 2620 (FIG. 27A, cross section X-X', and FIG. 27B, top view of the array without the dielectric layers). The resist is patterned to expose the source lines 178. Each source line 178 traverses the memory array between two adjacent control gate lines 170, and provides one source/drain region to each cell in the two rows associated with the two control gate lines.

The alignment of mask 2620 is not critical because the left and right edges of the mask openings can be positioned anywhere over the respective select gate lines 140 or control gate lines 170.

Silicon dioxide 220 is etched out of trenches 220T in the areas exposed by mask 2620, i.e. the areas of source lines 178. This etch removes oxide 150 in the active areas over the source lines. Then the source line implant (N+) is performed using the same mask. In some embodiments, this is a high energy, high dose implant, possibly preceded by a lower energy, low dose, large angled implant (the angle can be 10° to 30° for example), to achieve a 0.1 µm to 0.2 µm source line diffusion depth.

In an alternative embodiment, mask 2620 is formed, then a high energy N+ implant is performed before etching out the oxide 220, then the oxide 220 is etched out of the trenches using the same mask, and then another, lower energy N type implant is performed using the same mask. The first (high energy) implant is at least partially blocked by oxide 220 in the trenches to avoid shorting the source lines 178 to N type isolation region 604 (FIG. 6). See the aforementioned U.S. Pat. No. 6,355,524.

Resist 2620 is removed. A thin silicon dioxide layer 2904 (FIG. 28A, cross section X-X') is deposited over the structure by any suitable technique (e.g. TEOS, HTO, RTO). An exemplary thickness of oxide 2904 on the silicon surface of substrate 120 is 200 Å to 300 Å. If oxide 2904 is deposited thermally (e.g. by RTO, rapid thermal oxidation), the oxide will be much thinner on the silicon nitride surfaces.

Figure 28B:
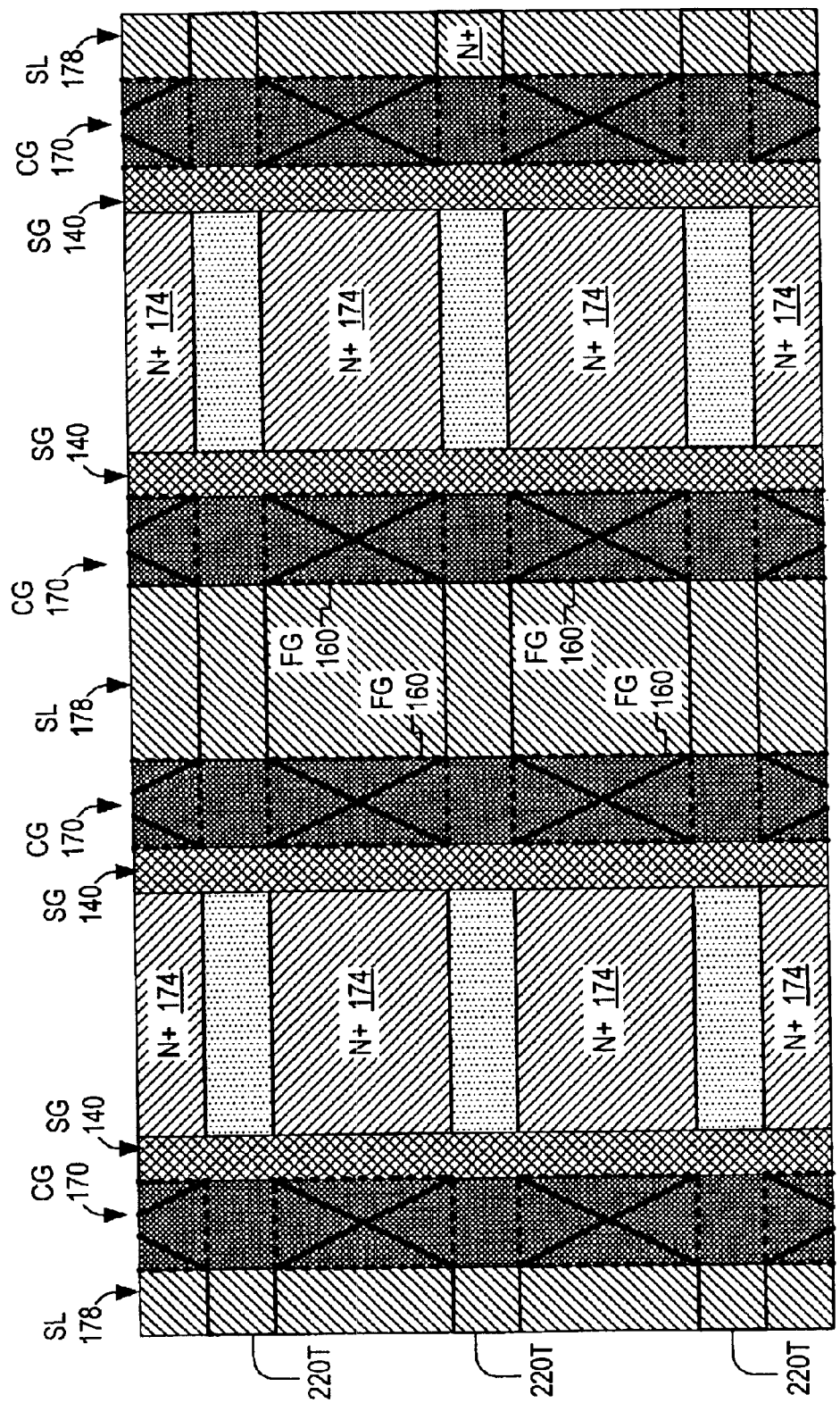
FIG. 28B is a top view of the memory of FIGS. 3A, 3B in the process of fabrication.

A thin silicon nitride layer 2910 is deposited and etched anisotropically without a mask to form sidewall spacers on the gates of the peripheral transistors (not shown). Spacers 2910 also form in the memory array. Oxide 2904 serves as an etch stop protecting the substrate 120. An N+ implant is performed to create LDD (lightly doped drain) structures for the peripheral NMOS transistors (not shown), increase the dopant concentration in the peripheral NMOS transistor gates and in source line regions 178, and to dope bitline regions 174. FIG. 28B is a top view of the resulting memory array structure. The floating, control and select gates and the overlying nitride layers mask this implant so no additional masking in the array area is needed.

The memory fabrication can be completed using known techniques. In the example of FIG. 29, inter-level dielectric 3204 is deposited over the wafer. Contact openings are etched in dielectric layers 3204, 2904, 150 to expose the bitline regions 174. A conductive layer 3210 is deposited and patterned to form the bitlines that contact the bitline regions 174. If the layers 3204, 2904, 150 are formed from silicon oxide, the alignment of the mask (not shown) defining the contact openings is not critical because the select gates 140 are protected by nitride layers 2910, 1030.

Figure 30:
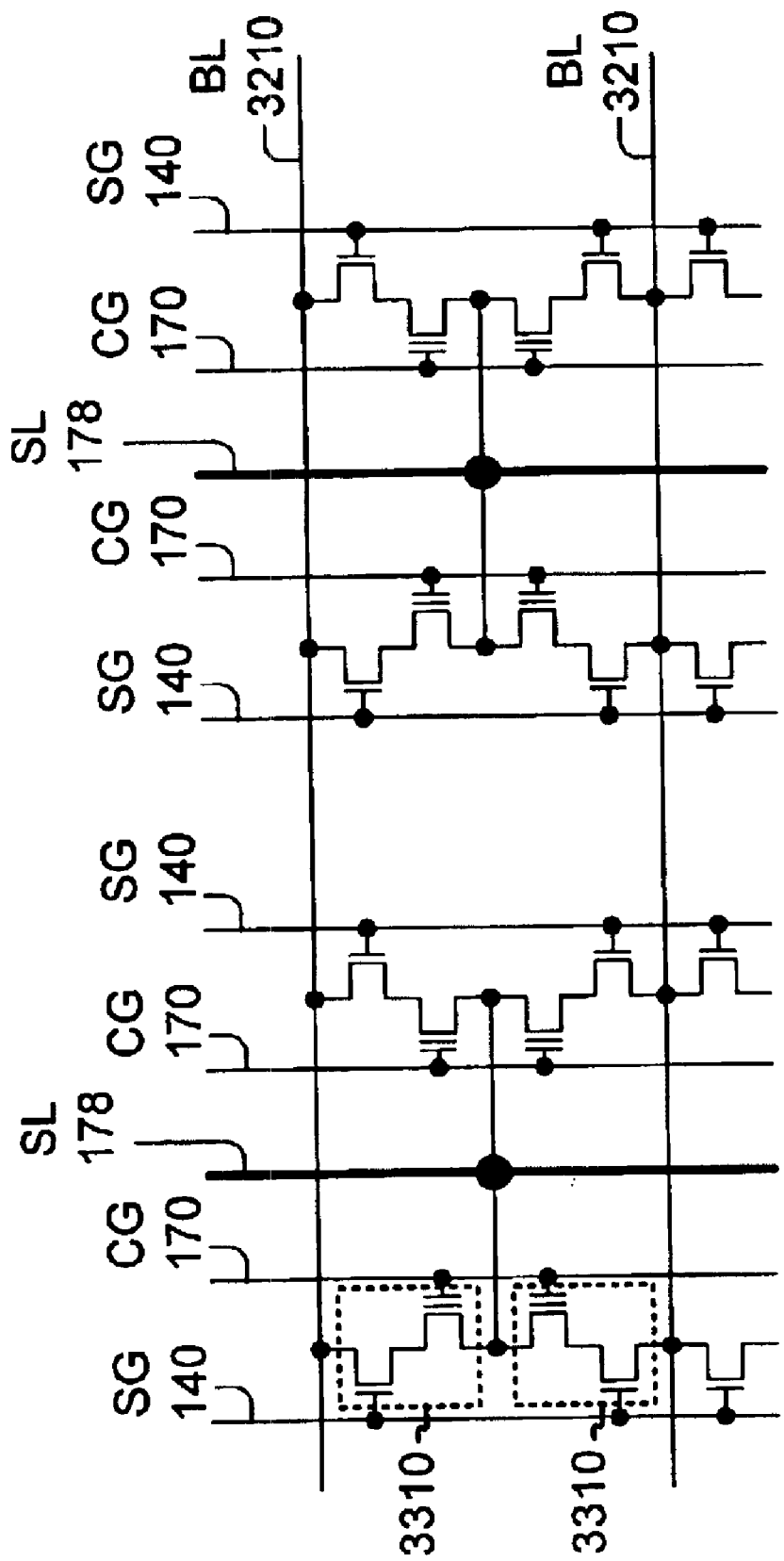
FIG. 30 is a circuit diagram of the memory of FIGS. 3A, 3B.

FIG. 30 is a circuit diagram of one embodiment of the array. This is a NOR array, of the type described in the aforementioned U.S. Pat. No. 6,355,524. Each bitline 3210 is shared by two columns of the memory cells 3210. A cell 3210 is programmed by hot electron injection from the cell's channel region (the P type region in substrate 120 below the cell's floating and select gates) to floating gate 160. The cell is erased by Fowler-Nordheim tunneling of electrons from floating gate 160 to source line region 178 or the channel region. The cell is read by sensing a current on the corresponding bitline region 174. Select gates 140 are driven to a suitable high voltage to select corresponding memory rows during the read, program, and possibly erase operations.

Other details of the memory fabrication process are given in U.S. patent application attorney docket number M-12902 US, entitled "NONVOLATILE MEMORIES AND METHODS OF FABRICATION", filed by Yi Ding and incorporated herein by reference.

Figure 31:
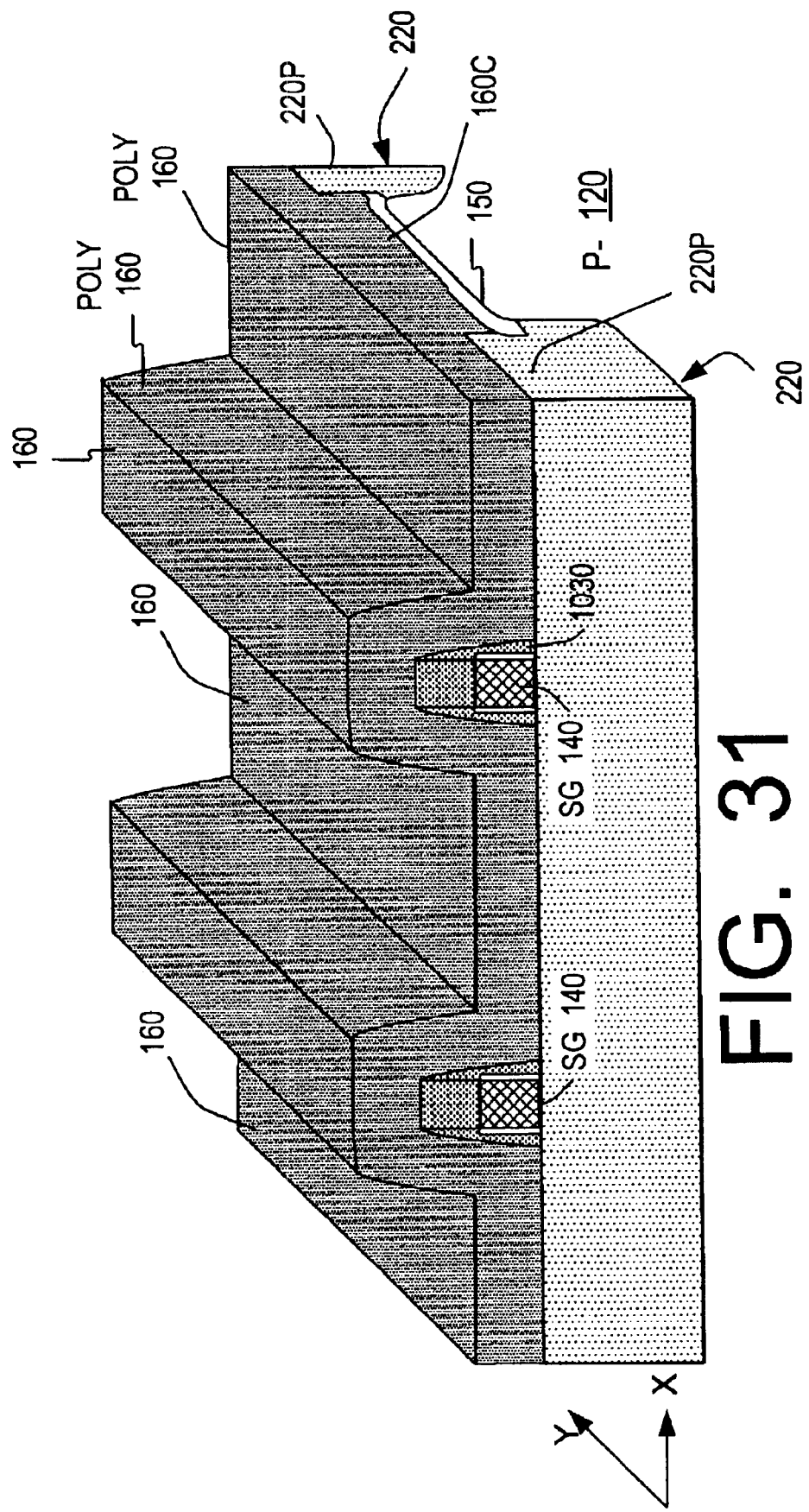
FIGS. 31–35 are perspective views of memories in the process of fabrication according to embodiments of the present invention.

In FIG. 31, the floating gate is fabricated using a single polysilicon layer 160. The wafer is processed through the stage of FIG. 9, then the polysilicon 160 is deposited and suitably doped. An exemplary thickness of polysilicon 160 is 1600 Å. Polysilicon 160 includes portions 160C between the protrusions 220P of substrate isolation regions 220. Portions 160C have a planar top surface. This can be achieved by a conformal deposition of layer 160 (e.g. LPCVD) to a suitable thickness to cause the portions of layer 160 over the sidewalls of protrusions 220P to meet during the deposition. Of note, the polysilicon 160 is thicker at portions 160C than over the oxide 220P.

Figure 32:
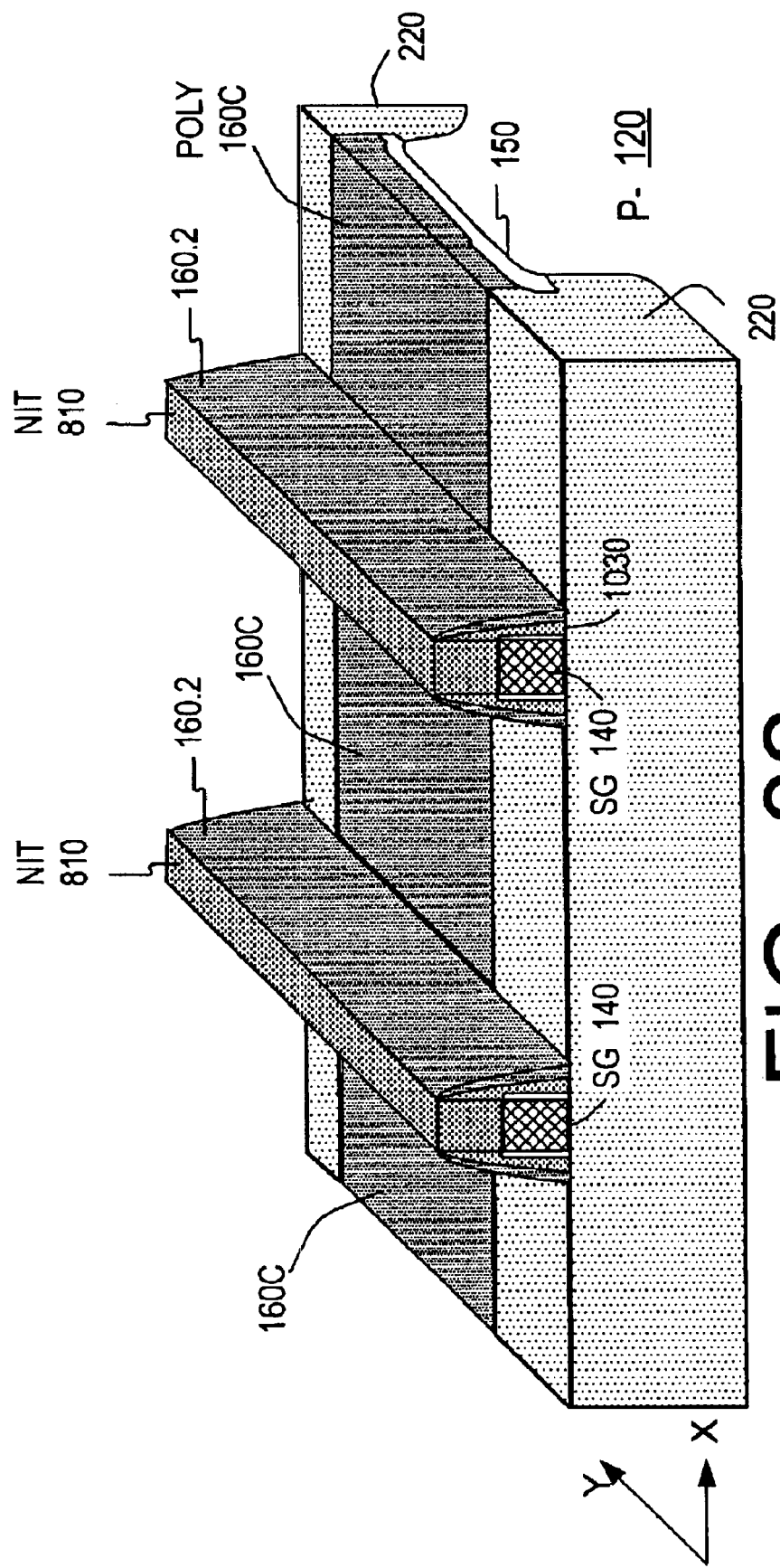

Polysilicon 160 is etched anisotropically, without a mask over the memory array, to form polysilicon spacers 160.2 (FIG. 32) over dielectric sidewalls 1030. The etch end point is the exposure of nitride 810 and/or trench oxide 220. Polysilicon is etched off the top surface of substrate isolation oxide 220. Polysilicon portions 160C are etched down, and their top surface becomes level with the top surface of oxide 220.

Then mask 1500 is formed as shown in FIG. 17A. The exposed portions of polysilicon spacers 160.2 are removed. The resulting structure is shown in FIG. 33.

The remaining fabrication steps can be as described above.

Figure 33:
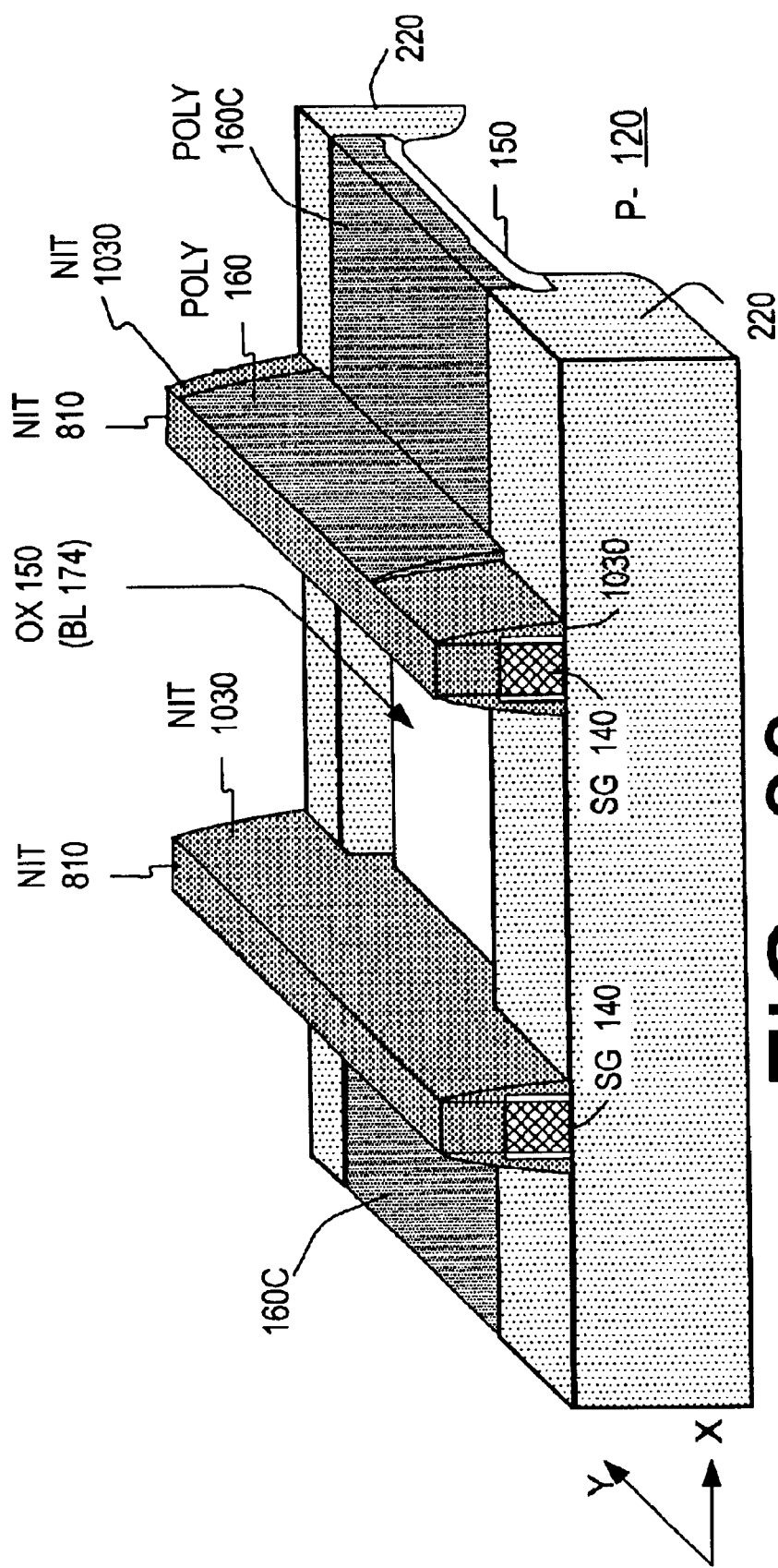
Figure 35:
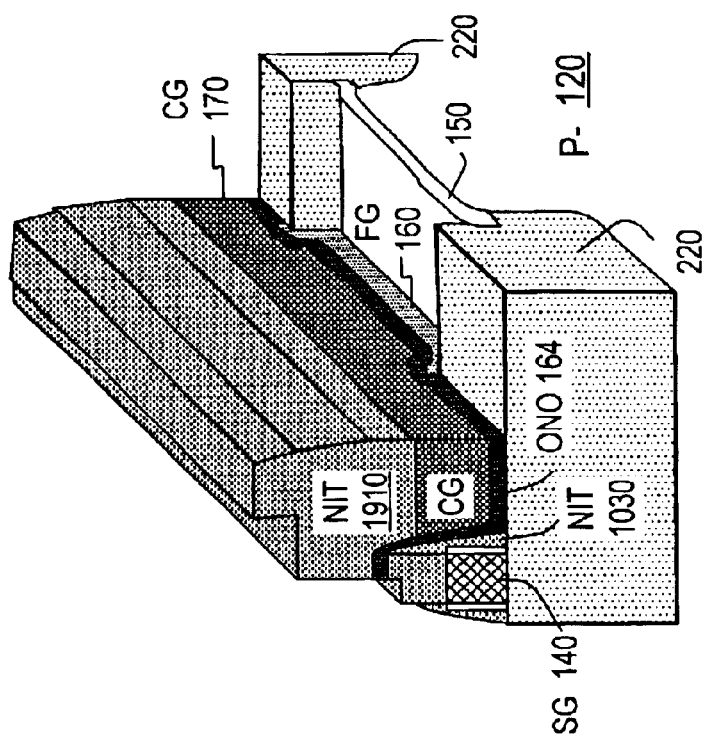
Figure 34:
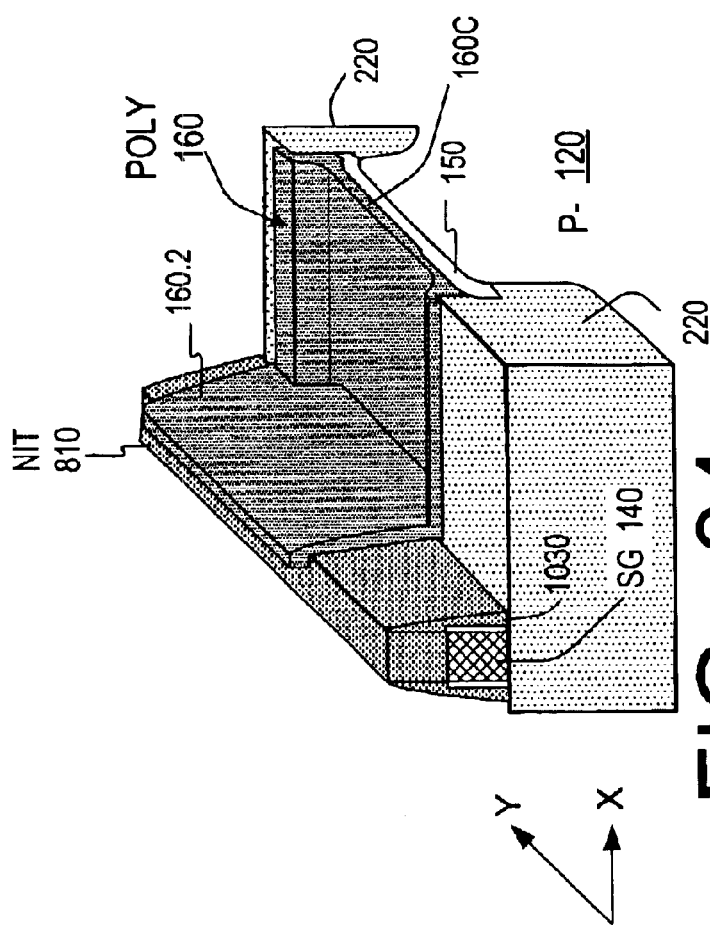

FIG. 34 shows another embodiment at the same stage of fabrication as FIG. 33. The structure was processed as in FIG. 31, but polysilicon 160 was a thinner layer. Consequently, the top surface of portions 160C was not planar, it fell below the top surfaces of protrusions 220P (the portions 160C were conformal). The anisotropic etch of FIG. 32 was omitted. Mask 1500 was formed over the structure of FIG. 31, and the exposed portions of polysilicon 160 were etched away to produce the structure of FIG. 34. Due to the topography of polysilicon portions 160C, each floating gate 160 goes up and down the sidewalls of protrusions 220P. This contour is repeated by control gate 170 (FIG. 35). Advantageously, the floating gate has a greater surface area facing the control gate 170, so the capacitive coupling between the floating and control gates is increased.

FIG. 36 shows an exemplary X-X' cross section of the memory of FIG. 35.

Figure 37:
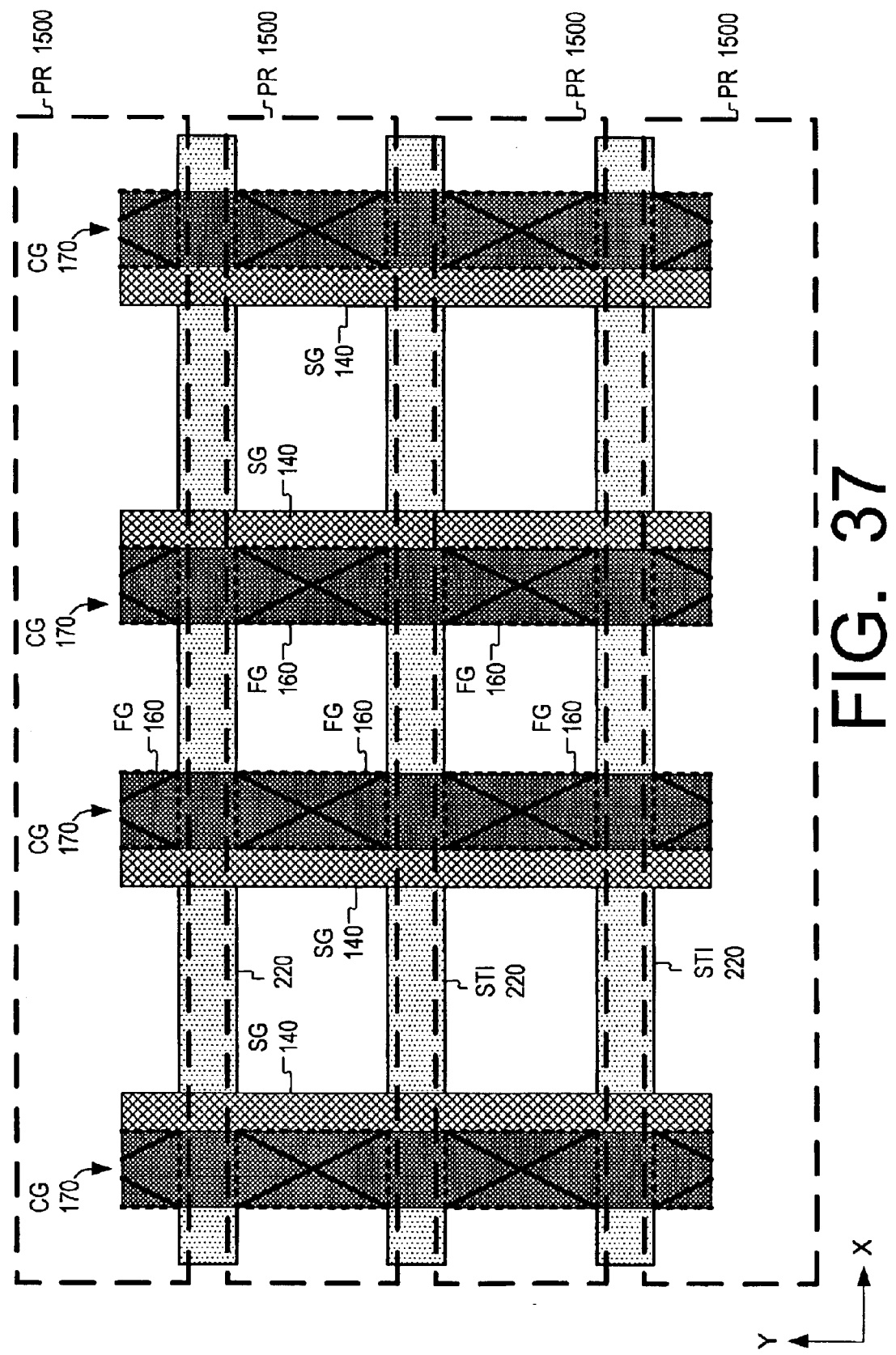
FIGS. 37, 38 are top views of memory arrays in the process of fabrication according to embodiments of the present invention.
Figure 38:
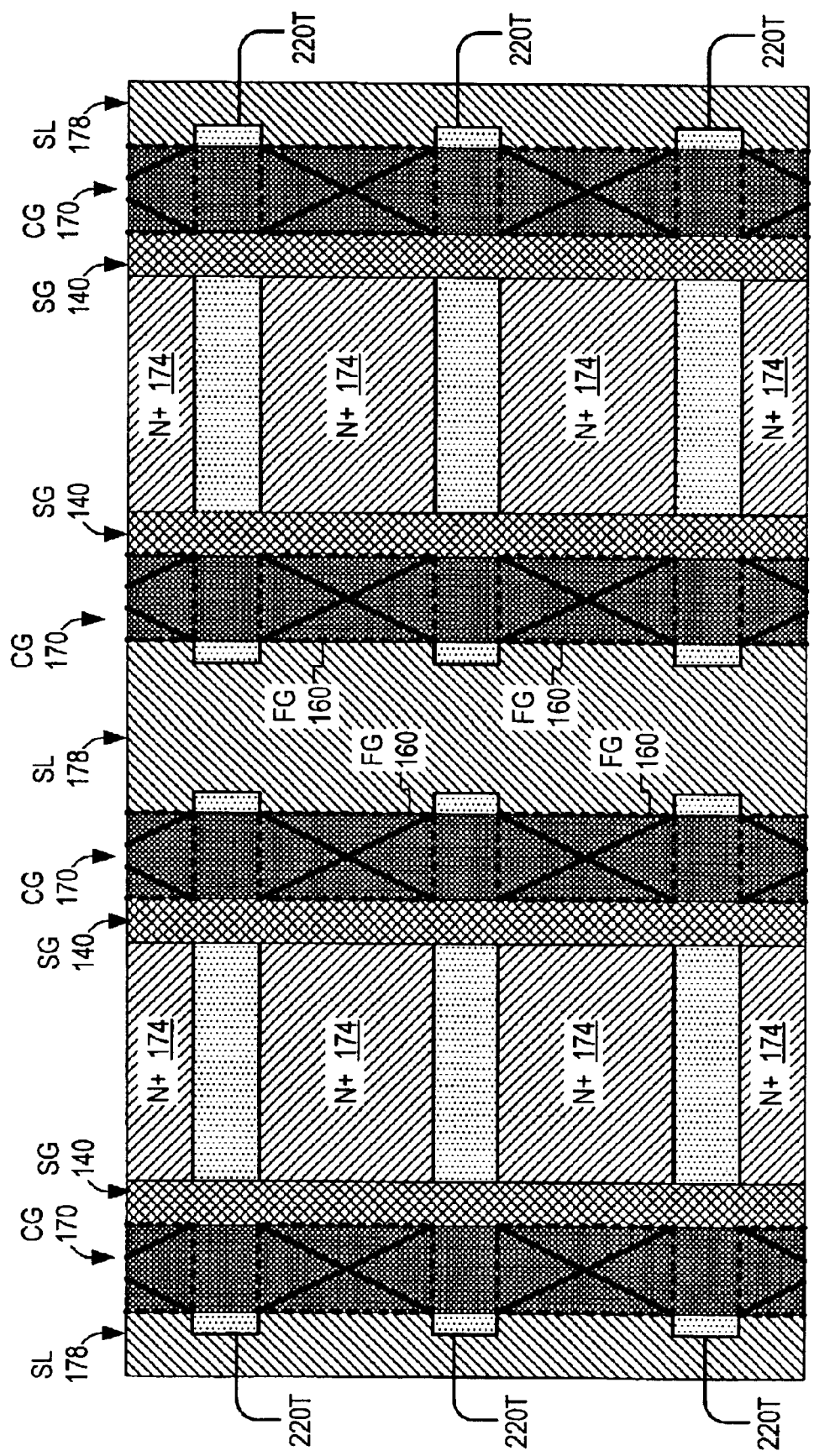

The invention is not limited to any particular read, erase or programming techniques, to NOR memory arrays, or to a particular array architecture or fabrication method. For example, the mask 1500 (FIG. 17A) may consist of a number of strips extending in the X direction through the entire memory array, as shown in FIG. 37. The source lines can be formed from a layer overlying the substrate 120 and contacting the source line substrate regions 178; the source lines do not have to go through the isolation trenches. Also, substrate isolation regions 220 do not have to traverse the entire array. In FIG. 38, the substrate isolation regions are interrupted at source lines 178. Dielectric 220 does not have to be etched out of the trenches before the source lines are doped. Substrate isolation can be formed by methods described in U.S. patent application No. 10/266,378 filed Oct. 7, 2002 by Chia-Shun Hsiao and incorporated herein by reference. Shallow trench isolation can be replaced with LOCOS or other isolation types, known or to be invented. The invention is applicable to multi-level memory cells (such a cell can store multiple bits of information). Other embodiments and variations are within the scope of the invention, as defined by the appended claims.

What is claimed is:

1. A method for manufacturing an integrated circuit comprising a nonvolatile memory, the method comprising:
   forming a first structure over a semiconductor substrate, the first structure comprising:

a first conductive gate of a nonvolatile memory cell; and a first dielectric over the first conductive gate;

forming a layer ("FG layer") to provide a conductive floating gate for the memory cell, wherein the floating gate comprises a first portion and an upward protruding second portion, the second portion being formed over the first dielectric over at least a sidewall of the first conductive gate;

forming a second dielectric over the FG layer;

forming a layer G2 over first structure, the FG layer, and the second dielectric, to provide a second conductive gate for the memory cell;

removing a portion of the layer G2 such that the top of the second conductive gate becomes not higher than the top of the floating gate.

2. The method of claim 1 wherein the FG layer comprises a first sub-layer and a second sub-layer formed after the first sub-layer, wherein the first portion of the floating gate is formed from the first sub-layer, and the second portion of the floating gate is formed from the second sub-layer.

3. The method of claim 1 wherein the FG layer consists of one or more sub-layers all of which are present in both the first and the second portions of the floating gate.

4. The method of claim 3 wherein forming the FG layer comprises:

forming the FG layer over the first structure; and then etching the FG layer anisotropically without a mask over the memory cell to remove the FG layer from over the top of the first structure but leave the FG layer over the first dielectric over the sidewall of the first structure.

5. The method of claim 4 further comprising forming substrate isolation regions, each substrate isolation region being a dielectric region having a portion protruding above the semiconductor substrate;

wherein forming the FG layer over the first structure results in the FG layer having a greater thickness between the substrate isolation regions next to the first structure than over the substrate isolation regions;

wherein etching the FG layer results in the FG layer being etched off from over at least portions of the substrate isolation regions and the first structure but not between the substrate isolation regions next to the first structure.

6. The method of claim 1 wherein the memory cell is one of a plurality of the memory cells, and the method further comprises a masked etch of the FG layer to remove portions of the FG layer between different memory cells.

7. A method for manufacturing an integrated circuit comprising a nonvolatile memory, the method comprising:

forming a first structure overlying the semiconductor substrate, the first structure comprising:
a first conductive gate of a nonvolatile memory cell; and
a first dielectric over a sidewall of the first conductive gate;

forming a layer ("FG layer") to provide a conductive floating gate for the memory cell, wherein the FG layer comprises first and second sub-layers, and wherein forming the FG layer comprises:
forming the first sub-layer to provide a first portion of the floating gate, the first structure protruding above the first sub-layer;
forming the second sub-layer layer and etching the second sub-layer to form a second portion of the floating gate on the sidewall of the first structure;

forming a second dielectric over the first and second sub-layers;

forming a second conductive gate for the memory cell on the second dielectric.

8. The method of claim 7 wherein etching the second sub-layer comprises an etch of the second sub-layer without a mask over the memory cell.

9. The method of claim 7 wherein the memory cell is one of a plurality of the memory cells, and the method further comprises a masked etch of the second sub-layer to remove portions of the second sub-layer between different memory cells.

10. The method of claim 7 wherein the top of the second conductive gate is not higher than the top of the second portion of the floating gate.

11. A method for manufacturing an integrated circuit comprising a nonvolatile memory, the method comprising:

forming a first structure over a semiconductor substrate, the first structure comprising:
a first conductive gate of a nonvolatile memory cell; and
a first dielectric over the first conductive gate;

forming a layer ("FG layer") to provide a conductive floating gate for the memory cell, wherein the floating gate comprises a first portion and an upward protruding second portion, the second portion being formed over the first dielectric over at least a sidewall of the first conductive gate;

forming a second dielectric over the FG layer;

forming a layer G2 over first structure, the FG layer, and the second dielectric, to provide a second conductive gate for the memory cell, the layer G2 having a portion P1 protruding above the first structure;

forming a layer L1 over the layer G2 such that the protruding portion P1 of the layer G2 is exposed and not completely covered by the layer L1;

partially removing the layer G2 selectively to the layer L1 to form a cavity at the location of the portion P1;

forming a layer L2 at least in the cavity;

removing at least a part of the layer L1 and the layer G2 selectively to the layer L2.

12. A method for manufacturing an integrated circuit comprising a nonvolatile memory comprising nonvolatile memory cells, the method comprising:

forming one or more substrate isolation regions in a semiconductor substrate;

forming one or more first structures over the semiconductor substrate, each first structure comprising:
a conductive line G1, wherein each memory cell comprises a first conductive gate comprising a portion of a line G1; and
a first dielectric over the lines G1;

forming a layer ("FG layer") to provide a conductive floating gate for each memory cell, wherein each floating gate comprises a first portion and an upward protruding second portion, the second portion being formed on the first dielectric and overlaying at least a sidewall of a line G1;

patterning the FG layer through a mask opening or openings to remove portions of the FG layer between different memory cells, wherein all edges of the mask openings in memory cell areas are positioned over the lines G1 and/or the substrate isolation regions.

13. The method of claim 12 further comprising:
forming a second dielectric over the FG layer;
forming a layer G2 over first structure, the FG layer, and the second dielectric, to provide the second conductive gate for the memory cell;
removing portions of the layer G2 and the FG layer to form the second conductive gates and the floating gates.

14. The method of claim 12 wherein the FG layer comprises a first sub-layer and a second sub-layer formed after the first sub-layer, wherein the first portion of the floating gate is formed from the first sub-layer, and the second portion of the floating gate is formed from the second sub-layer.

15. The method of claim 12 wherein the FG layer consists of one or more sub-layers all of which are present in both the first and the second portions of the floating gate.

16. An integrated circuit comprising:
a semiconductor substrate;
a first dielectric region on the semiconductor substrate;
a first conductive gate of a nonvolatile memory cell on the first dielectric region;
a second dielectric region of the memory cell on the semiconductor substrate;
a conductive floating gate of the memory cell on the second dielectric region, the floating gate comprising a first portion and an upward protruding second portion, wherein in any horizontal cross section by a plane passing through the upward protruding second portion and the first conductive gate, the distance between the upward protruding second portion and the first conductive gate is smaller than the width of the first conductive gate;
a second conductive gate overlying at least a portion of the floating gate but not overlying the first conductive gate;
a dielectric insulating the floating gate from the first and second conductive gates, and insulating the first conductive gate from the second conductive gate.

17. The integrated circuit of claim 16 wherein in top view the distance between the upward protruding portion and the first conductive gate is smaller than the width of the first conductive gate.

18. The integrated circuit of claim 16 wherein the upward protruding portion overlies a portion of the first conductive gate.

19. The integrated circuit of claim 16 wherein the upward protruding portion does not overlie the first conductive gate.

20. The integrated circuit of claim 16 wherein an overlap between the upward protruding portion and the second conductive gate is at least as large as the thickness of the second conductive gate.

21. The integrated circuit of claim 16 wherein an overlap between the upward protruding portion and the second conductive gate is at least 0.08 $\mu$m.

22. The integrated circuit of claim 16 wherein the top of the second conductive gate is not higher than the top of the upward protruding portion.

23. The integrated circuit of claim 16 wherein the top of the second conductive gate is lower than the top of the upward protruding portion.

24. An integrated circuit comprising:
a semiconductor substrate;
a first dielectric region on the semiconductor substrate;
a first conductive gate of a nonvolatile memory cell on the first dielectric region;
a second dielectric region of the memory cell on the semiconductor substrate;
a conductive floating gate of the memory cell on the second dielectric region;
a second conductive gate overlying a portion of the floating gate, wherein the top of the second conductive gate is not higher than the top of the floating gate;
a dielectric insulating the floating gate from the first and second conductive gates, and insulating the first conductive gate from the second conductive gate.

25. The integrated circuit of claim 24 wherein the top of the second conductive gate is lower than the top of the floating gate.

26. An integrated circuit comprising:
a semiconductor substrate;
a first structure overlying the semiconductor substrate, the first structure comprising:
a first conductive gate of a nonvolatile memory cell; and
a first dielectric on a sidewall of the first conductive gate;
a conductive floating gate of the memory cell on a second dielectric region, the floating gate comprising an upward protrusion formed as a spacer on a sidewall of the first dielectric;
a second conductive gate overlying at least a portion of the floating gate but not overlying the first conductive gate, wherein the upward protrusion of the floating gate is between the first and second conductive gates;
a dielectric insulating the floating gate from the second conductive gate.

27. An integrated circuit comprising:
a semiconductor substrate;
a first dielectric region on the semiconductor substrate;
a first conductive gate of a nonvolatile memory cell on the first dielectric region;
a second dielectric region of the memory cell on the semiconductor substrate;
a conductive floating gate of the memory cell on the second dielectric region, the floating gate comprising an upward protrusion at an edge of the floating gate adjacent to the first conductive gate but not at an opposite edge of the floating gate;
a second conductive gate overlying at least a portion of the floating gate but not overlying the first conductive gate, wherein the upward protrusion of the floating gate is between the first and second conductive gates;
a dielectric insulating the floating gate from the first and second conductive gates, and insulating the first conductive gate from the second conductive gate.

* * * * *